United States Patent
Brodsky et al.

(10) Patent No.: US 7,658,617 B1
(45) Date of Patent: Feb. 9, 2010

(54) PLASTIC LAND GRID ARRAY (PLGA) MODULE WITH INVERTED HYBRID LAND GRID ARRAY (LGA) INTERPOSER

(75) Inventors: William Louis Brodsky, Binghamton, NY (US); Mark Kenneth Hoffmeyer, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/364,110

(22) Filed: Feb. 2, 2009

(51) Int. Cl.
*H01R 12/00* (2006.01)
(52) U.S. Cl. ........................................... 439/66; 439/83
(58) Field of Classification Search ................... 439/66, 439/91, 70, 83; 174/250, 8
See application file for complete search history.

(56) References Cited

U.S. PATENT DOCUMENTS 5,152,694 A * 10/1992 Bargain ........................ 439/66
5,967,797 A * 10/1999 Maldonado ................... 439/66

OTHER PUBLICATIONS

Luc Guerin et al., "Spring Land Grid Array Development: An Integrated Demountable Solution", MicroNews (A publication of IBM Microelectronics), Third Quarter 2001, pp. 22-24, vol. 7, No. 3, <http://www.-03.ibm.com/chips/micronews/vol7_no3/mn_vol7_no3_fnl.pdf.>.

* cited by examiner

*Primary Examiner*—Khiem Nguyen
(74) *Attorney, Agent, or Firm*—Matthew J. Bussan

(57) ABSTRACT

An enhanced contact construction and loading support mechanism for plastic land grid array (PLGA) modules. A plurality of inverted hybrid land grid array (LGA) contacts are each respectively captured in and extend at least partially through one of a plurality of holes of an inverted hybrid LGA interposer. The inverted hybrid LGA contacts are affixed to a plurality of metal pads on a PLGA module carrier. Preferably, the inverted hybrid LGA contacts are affixed simultaneously using surface-mount technology (SMT) and have a metallurgy construction (e.g., beryllium-copper springs coated with nickel and hard gold) that provides enhanced wear and corrosion resistance. Each of the inverted hybrid LGA contacts is configured to make mechanical/pressure contact with a metal contact on another substrate, such as a printed wiring board (PWB). The inverted hybrid LGA interposer supports the PLGA module carrier and, in addition, a stiffener frame (with or without a heat sink) may be provided to reinforce the PLGA module carrier.

20 Claims, 12 Drawing Sheets

PLASTIC LAND GRID ARRAY (PLGA) MODULE WITH INVERTED HYBRID LAND GRID ARRAY (LGA) INTERPOSER

CROSS-REFERENCE TO RELATED APPLICATION

This patent application is related to pending U.S. patent application Ser. No. 12/146,757, filed Jun. 26, 2008, entitled "PLASTIC LAND GRID ARRAY (PLGA) MODULE AND PRINTED CIRCUIT BOARD (PWB) WITH ENHANCED CONTACT METALLURGY CONSTRUCTION", which is assigned to the assignee of the instant application and which is incorporated by reference herein in its entirety.

BACKGROUND OF THE INVENTION

1. Field of Invention

The present invention relates in general to the electrical connector field. More particularly, the present invention relates to plastic land grid array (PLGA) modules that incorporate inverted hybrid land grid array (LGA) interposers.

2. Background Art

Electrical connectors are in widespread use in the electronics industry. In many computer and other electronic circuit structures, an electronic module such as a central processor unit (CPU), memory module, application-specific integrated circuit (ASIC) or other integrated circuit, must be connected to a printed wiring board (PWB). Printed wiring boards are also known as printed circuit boards (PCBs). When populated with one or more electronic components, a printed wiring board is often referred to as a printed wiring board assembly (PWBA) or a printed circuit board assembly (PCBA). In connecting an electronic module to a PWB, a plurality of individual electrical contacts on the base of the electronic module must be connected to a plurality of corresponding individual electrical contacts on the PWB. This set of contacts on the PWB dedicated to contacting the electronic module contacts is known as a land grid array (LGA) site when a LGA connector is used to connect the electronic module to the PWB.

Rather than permanently soldering the electronic module contacts to the LGA site, it is desirable to use LGA connectors that allow the electronic module to be installed to and removed from the LGA site. LGA connectors provide the user with the flexibility to upgrade or replace electronic modules during the manufacturing cycle and in the field. LGA connectors are also known as interconnects. Generally, LGA connectors include "true" LGA connectors where both the PWB and the electronic module are mated with contacts through mechanical/pressure contact, as well as "hybrid" LGA connectors where the contacts are soldered to the PWB and make mechanical/pressure contact with the electronic module.

In general, LGA connectors provide electrical connections between two parallel electrical substrates in computing equipment through the use of an interposer. These interposers are also known as "sockets". Typically, one of these substrates is a PWB and the other is an electronic module having either a ceramic laminate substrate or an organic laminate substrate. In the latter case of an electronic module having an organic laminate substrate, which is referred to herein as a plastic land grid array (PLGA) module, a plurality of individual LGA connectors extending through the interposer provide electrical connection between a plurality of corresponding individual electrical contacts on the PWB and on the PLGA module. Typically, the actuation forces to provide the contact normal force, i.e., the force exerted on the LGA contacts in a direction normal to the plane of the substrates in order to provide the aforementioned electrical connection, are sufficiently large as to require stiffening and support of the PLGA module.

Most LGA connector technologies utilize individual electrical contacts that bear on wear resistant noble metal contact finishes to ensure interconnect robustness through application life. Although LGA connectors possess optimized surface finishes, various package process methods for PLGA modules limit the amount, thickness, and type of noble metal finish that can be directly plated onto the interconnect pads of PLGA modules. Electrolytic nickel and gold plating processes, for example, generally cannot be used on the interconnect pads of PLGA modules due to electrical commoning requirements that drive wiring and process issues associated with the contact interface structure. It is typically preferable to use electrolytic nickel and gold plating processes to plate interconnect pads, if possible, because these processes can provide a thick nickel underplating (which may, for example, minimize diffusion of copper from the interconnect pad) and a thick, hard gold plating (which may, for example, provide wear and corrosion resistance).

Instead, electroless nickel and gold plating processes must generally be used on the interconnect pads of PLGA modules. Although these surface finish types offer some level of chemical nobility, thickness and hardness, the electroless nickel and gold plating processes are very restricted and provide narrow, if any, margin to ensure surface finish reliability in service. For example, electroless nickel and gold plating processes provide a relatively thin nickel underplating (which is less likely to sufficiently limit diffusion of copper from the interconnect pad) and a relatively thin, porous gold plating (which is less likely to provide sufficient wear and corrosion resistance). These limitations can be especially problematic in service applications that involve high plug/unplug counts and/or in service applications that are performed in corrosive operating environments.

To address limitations such as these, U.S. patent application Ser. No. 12/146,757, filed Jun. 26, 2008, entitled "PLASTIC LAND GRID ARRAY (PLGA) MODULE AND PRINTED CIRCUIT BOARD (PWB) WITH ENHANCED CONTACT METALLURGY CONSTRUCTION", which is assigned to the assignee of the instant application and which is incorporated by reference herein in its entirety, discloses an enhanced contact metallurgy construction for substrates, such as plastic land grid array (PLGA) modules. A plurality of "button" preform contacts are each respectively soldered to one of a plurality of metal pads on a PLGA module carrier. Each of the button preform contacts comprises a metal preform base (e.g., copper), an electrolytic non-noble metal underplating (e.g., nickel), and an electrolytic noble metal plating (e.g., gold). In one embodiment, the electrolytic non-noble metal underplating is 80-400 microinches thick to provide an enhanced diffusion barrier, and the electrolytic noble metal plating is 30-60 microinches thick and incorporates one or more hardening agents to provide enhanced wear and corrosion resistance. Although the button preform contact solution typically provides a reliable electrical interconnection, an alternative approach may be desirable for a particular application and/or for various reasons such as cost and performance.

To eliminate the need to use a socket, a spring land grid array (SLGA) was developed that joins a compliant conductive spring on each of the I/O pads of an IC package. See, Luc Guerin, Patrick Coico, and Brenda Peterson, "Spring Land Grid Array Development: An Integrated Demountable Solution", MicroNews (A publication of IBM Microelectronics), Vol. 7, No. 3, pages 22-24, Third Quarter 2001. Available at the web site, http://www-03.ibm.com/chips/micronews/vol7_no3/mn_vol7_no3_fnl.pdf. The SLGA uses a standard area-array module with a connector spring (i.e., a tapered, cantilevered leaf spring) soldered to each I/O pad of the area array. The connector springs are miniature beryllium-copper springs coated with nickel and gold. A frame is permanently attached on the SLGA module to maintain the standoff height, as well as align the module relative to the PCB card. The IC package may be ceramic, laminate, molded plastic, or other suitable material. Although the SLGA solution provides a reliable electrical interconnection in many cases, it introduces other problems. For example, the SLGA solution requires the connector springs to be individually soldered to each I/O pad of the area array. This is a difficult, time-consuming and costly task. Moreover, the utilization of a frame in the SLGA solution typically does not provide a sufficient loading support mechanism in the case of PLGA modules. As mentioned above, PLGA modules typically require stiffening and support of their organic laminate substrates to accommodate large actuation forces. The frame in the SLGA solution, which provides support only at the periphery of the area array, typically does not provide a sufficient loading support mechanism in the case of PLGA modules.

It should therefore be apparent that a need exists for an enhanced contact construction and loading support mechanism for PLGA modules.

SUMMARY OF THE INVENTION

According to the preferred embodiments of the present invention, a plurality of inverted hybrid land grid array (LGA) contacts are each respectively captured in and extend at least partially through one of a plurality of holes of an inverted hybrid LGA interposer. The inverted hybrid LGA contacts are affixed to a plurality of metal pads on a PLGA module carrier. Preferably, the inverted hybrid LGA contacts are affixed simultaneously using surface-mount technology (SMT) and have a metallurgy construction (e.g., beryllium-copper springs coated with nickel and hard gold) that provides enhanced wear and corrosion resistance. Each of the inverted LGA contacts is configured to make mechanical/pressure contact with a metal contact on another substrate, such as a printed wiring board (PWB). The inverted hybrid LGA interposer supports the PLGA module carrier and, in addition, a stiffener frame (with or without a heat sink) may be provided to reinforce the PLGA module carrier.

The foregoing and other features and advantages of the present invention will be apparent from the following more particular description of the preferred embodiments of the present invention, as illustrated in the accompanying drawings.

BRIEF DESCRIPTION OF THE DRAWINGS

The preferred exemplary embodiments of the present invention will hereinafter be described in conjunction with the appended drawings, where like designations denote like elements.

In FIG. 1, a stiffener frame lies above the PLGA module carrier while an interposer frame lies below the PLGA module carrier.

In FIG. 5, the metal pads of the plastic land grid array (PLGA) module carrier are coated with a solder paste in accordance with the preferred embodiments of the present invention.

In FIG. 8, the LGA interposer is affixed to the plastic land grid array (PLGA) module carrier using adhesive in accordance with the preferred embodiments of the present invention.

In FIG. 9, the land grid array (LGA) interposer is coated with adhesive, while the metal pads of the plastic land grid array (PLGA) module carrier are coated with an electrically-conductive adhesive in accordance with the preferred embodiments of the present invention.

In FIG. 10, the LGA interposer is affixed to the plastic land grid array (PLGA) module carrier using metal support pads that are soldered together in accordance with the preferred embodiments of the present invention.

In FIG. 11, the metal pads (including the metal support pads) of the plastic land grid array (PLGA) module carrier are coated with a solder paste in accordance with the preferred embodiments of the present invention.

In FIG. 12, a stiffener frame lies above the PLGA module carrier while an interposer frame lies below the PLGA module carrier.

In FIG. 13, an interposer frame lies below the PLGA module carrier.

DETAILED DESCRIPTION OF THE PREFERRED EMBODIMENTS

1.0 Overview

In accordance with the preferred embodiments of the present invention, a plurality of inverted hybrid land grid array (LGA) contacts are each respectively captured in and extend at least partially through one of a plurality of holes of an inverted hybrid LGA interposer. The inverted hybrid LGA contacts are affixed to a plurality of metal pads on a PLGA module carrier. Preferably, the inverted hybrid LGA contacts are affixed simultaneously using surface-mount technology (SMT) and have a metallurgy construction (e.g., beryllium-copper springs coated with nickel and hard gold) that provides enhanced wear and corrosion resistance. Each of the inverted hybrid LGA contacts is configured to make mechanical/pressure contact with a metal contact on another substrate, such as a printed wiring board (PWB). The LGA interposer supports the PLGA module carrier and, in addition, a stiffener frame (with or without a heat sink) may be provided to reinforce the PLGA module carrier.

2.0 Detailed Description

Figure 1:
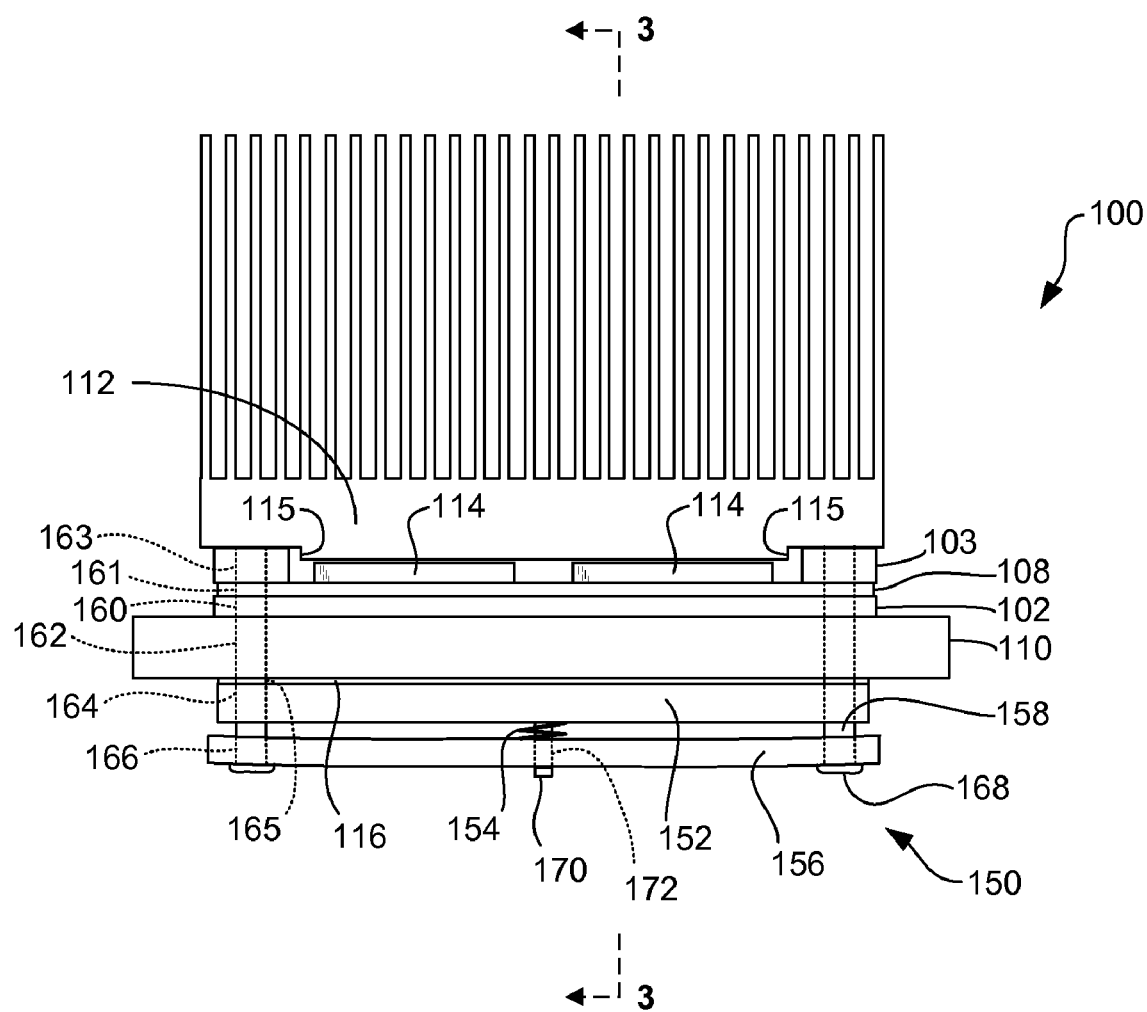
FIG. 1 is a side perspective view of a printed wiring board assembly (PWBA) having a printed wiring board (PWB) and a plastic land grid array (PLGA) module carrier that incorporates inverted hybrid land grid array (LGA) contacts in accordance with the preferred embodiments of the present invention.

With reference to the figures and in particular FIG. 1, there is depicted, in a side perspective view, a printed wiring board assembly (PWBA) 100 having a plastic land grid array (PLGA) module carrier 108 and a printed wiring board (PWB) 110. In accordance with the preferred embodiments of the present invention, the PWBA 100 incorporates inverted hybrid land grid array (LGA) contacts (e.g., the inverted hybrid LGA contacts 314 shown in FIG. 3). Preferably, the PLGA module carrier 108 is an organic laminate substrate having the inverted hybrid LGA contacts affixed to interconnect pads on the PLGA module carrier 108 using solder or electrically-conductive adhesive in accordance with the preferred embodiments of the present invention. Various package process methods for PLGA modules limit the amount, thickness, and type of noble metal finish that can be directly plated onto the interconnect pads of PLGA modules. This obstacle is overcome in accordance with the preferred embodiments of the present invention by affixing inverted hybrid LGA contacts onto the interconnect pads of PLGA modules using surface-mount technology (SMT). In accordance with the preferred embodiments of the present invention, electrolytic nickel and gold plated surfaces are provided on at least the portions of the inverted hybrid LGA contacts that are to make mechanical/pressure contact with the interconnect pads of the PWB. These electrolytic nickel and gold plated surfaces provide enhanced wear/corrosion resistance as compared to the electroless nickel and gold plated surfaces generally used on the interconnect pads on PLGA modules—i.e., the interconnect pads on PLGA modules, which typically make mechanical/pressure contact with conventional LGA connectors (i.e., conventional "true" LGA connectors or conventional "hybrid" LGA connectors), have limited wear/corrosion resistance because electroless nickel and gold plated surfaces must generally be used on the interconnect pads of PLGA modules.

Typically, it is preferable to use electrolytic nickel and gold plating processes to plate contacts that are to make mechanical/pressure contact because these processes can provide a thick nickel plate (which may, for example, minimize diffusion of copper to the gold plating) and a thick, hard gold plating (which may, for example, provide wear and corrosion resistance). Hence, it is especially advantageous to use an enhanced contact construction in accordance with the preferred embodiments of the present invention in service applications that involve high plug/unplug counts and/or in service applications that are performed in corrosive operating environments.

In accordance with the preferred embodiments of the present invention, the PWBA 100 incorporates a stiffener frame 103 overlying the PLGA module carrier 108 and an interposer frame 102 underlying the PLGA module carrier 108. The stiffener frame 103 is also referred to herein as a "clam shell". In addition, one or more LGA interposers (e.g., the LGA interposers 210 shown in FIG. 2), preferably received in one or more apertures extending through the interposer frame 102, also underlie(s) the PLGA module carrier 108. Preferably, the interposer frame 102 and the one or more LGA interposers support the PLGA module carrier 108 and, in addition, the stiffener frame 103, or "clam shell", reinforces the PLGA module carrier 108. This loading support mechanism in accordance with the preferred embodiments of the present invention, which serves to maintain planarity and support despite the application of significant actuation forces, is advantageous over the spring land grid array (SLGA) solution, which as discussed above in the Background Art, eliminates the need to use an LGA interposer at the expense of providing module support only at the periphery of the area array. In addition, because the inverted hybrid LGA contacts in accordance with the preferred embodiments of the present invention are captured in holes in one or more the LGA interposers, the inverted hybrid LGA contacts may be affixed simultaneously to the interconnect pads of the PLGA module carrier using surface-mount technology (SMT), which is advantageous over the SLGA solution wherein the connector springs must be individually soldered to each I/O pad of the area array.

Figure 2:
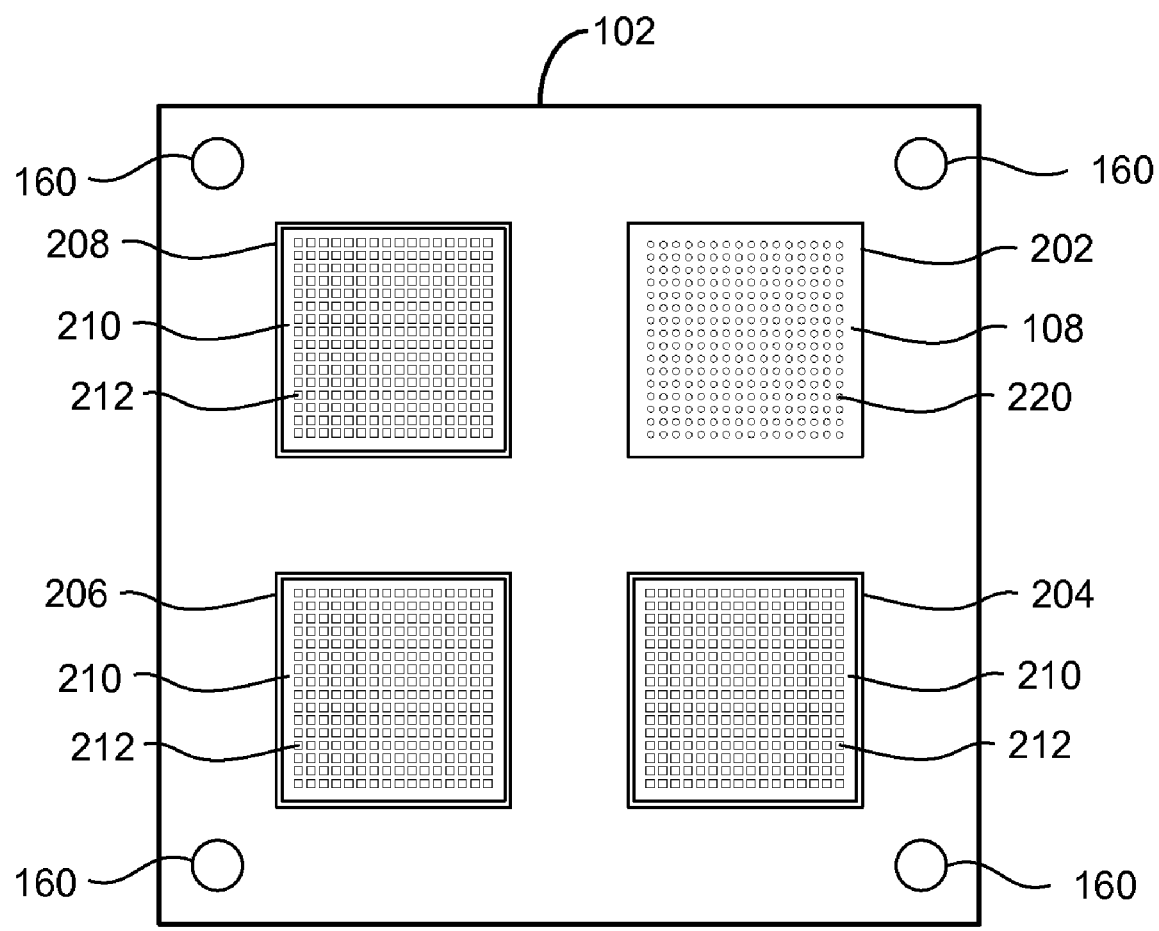
FIG. 2 is a bottom perspective view of the interposer frame utilized in the printed wiring board assembly (PWBA) shown in FIG. 1. The interposer frame is shown with one land grid array (LGA) interposer removed to reveal a module carrier having metal pads onto which are to be affixed inverted hybrid land grid array (LGA) contacts in accordance with the preferred embodiments of the present invention.

Referring temporarily to FIG. 2, as mentioned above, the interposer frame 102 is preferably provided with one or more LGA interposers 210 received in apertures 202 that extend through the interposer frame 102. Alternatively, or in addition, the one or more of the LGA interposers and the interposer frame 102 may be contiguous and joined integrally together as a one-piece unit.

The combination of the inverted hybrid LGA contacts captured in the one or more LGA interposers is also referred to herein as an "inverted hybrid LGA interposer". Although the preferred embodiments of the present invention are described herein within the context of a PLGA module with an inverted hybrid LGA interposer that connects the PLGA module to a PWB, one skilled in the art will appreciate that many variations are possible within the scope of the present invention. For example, a PLGA module with an inverted hybrid LGA interposer in accordance with the present invention may be utilized in connecting the PLGA module to any substrate, such as a ribbon substrate or another electronic module.

Referring again to FIG. 1, a rectilinear heat sink 112 is connected (i.e., mechanically) to at least one bare die or module cap 114, which in turn is/are connected (i.e., electrically and mechanically) to the PLGA module carrier 108. The at least one bare die or module cap 114 is/are also referred to herein as one or more "chips". Heat sink 112 provides heat transfer functions, as is well known in the art. Electronic components, such as microprocessors and integrated circuits, must operate within certain specified temperature ranges to perform efficiently. Excessive heat degrades electronic component performance, reliability, life expectancy, and can even cause failure. Heat sinks, such as rectilinear heat sink 112, are widely used for controlling excessive heat. Typically, heat sinks are formed with fins, pins or other similar structures to increase the surface area of the heat sink and thereby enhance heat dissipation as air passes over the heat sink. In addition, it is not uncommon for heat sinks to contain high performance structures, such as vapor chambers and/or heat pipes, to further enhance heat transfer. Heat sinks are typically formed of metals, such as copper or aluminum. The use of a heat sink, per se, is not necessary for purposes of the present invention, but is important in understanding an environment in which the present invention may be used.

Electronic components are generally packaged using electronic packages (i.e., modules) that include a module substrate, such as a ceramic or organic laminate module substrate, to which the electronic component is electronically connected. In some cases, the module includes a cap (i.e., capped modules) which seals the electronic component within the module. In other cases, the module does not include a cap (i.e., a bare die module). In the case of a capped module, a heat sink is typically attached with a thermal interface between a bottom surface of the heat sink and a top surface of the cap, and another thermal interface between a bottom surface of the cap and a top surface of the electronic component. In the case of a bare die module, a heat sink is typically attached with a thermal interface between a bottom surface of the heat sink and a top surface of the electronic component.

Each of one or more chips 114 is mounted on PLGA module carrier 108 and may be, for example, a central processor unit (CPU), memory module, application-specific integrated circuit (ASIC), or other integrated circuit. Typically, each of the one or more chips 114 comprises a flip-chip, which is a semiconductor or die having an array of spaced-apart terminals or pads on its base to provide base-down mounting of the flip-chip to the module carrier. Controlled collapse chip connection (C4) solder joints (also referred to as "solder bumps") are typically used to electrically connect the terminals or pads on the base of such a flip-chip with corresponding terminals or pads on the PLGA module carrier. C4 solder joints are disposed on the base of the flip-chip in an array of minute solder balls (e.g., on the order of 100 µm diameter and 200 µm pitch). The solder balls, which are typically lead (Pb)-containing solder, are reflowed to join (i.e., electrically and mechanically) the terminals or pads on the base of the flip-chip with corresponding terminals or pads on the PLGA module carrier.

As shown in FIG. 1, each of the one or more chips 114 is mounted on the upper surface of the PLGA module carrier 108. These chips 114 are often referred to as "primary components". Although not shown in FIG. 1, one or more chips, decoupling capacitors, or other components, may be mounted on the lower surface of the PLGA carrier 108. These chips, decoupling capacitors, or other components are often referred to as "secondary components".

Referring again to FIG. 1, a rigid insulator 116 is disposed along the bottom surface of PWB 110 and is preferably fabricated from fiberglass reinforced epoxy resin. Rigid insulator 116 is urged upwards against PWB 110, and PWB 110 is thereby urged upward towards the interposer frame 102 (as well as the one or more interposers received therein), the PLGA module carrier 108, and the stiffener frame 103 by a clamping mechanism. Preferably, the clamping mechanism is a post/spring-plate type clamping mechanism 150 as shown in FIG. 1. Because such clamping mechanisms are conventional, the post/spring-plate type clamping mechanism 150 is only briefly described below. Additional details about post/spring-plate type clamping mechanisms may be found in U.S. Pat. No. 6,386,890 to Bhatt et al., the disclosure of which is incorporated by reference herein. One skilled in the art will appreciate that any of the many different types and configurations of clamping mechanisms known in the art may be used in lieu of the post/spring-plate type clamping mechanism 150 shown in FIG. 1.

In the embodiment shown in FIG. 1, clamping mechanism 150 includes a stiffener plate 152, which is preferably a steel or other metal plate. An upward force is generated by a spring 154, which directs force upward against stiffener plate 152 through interaction with a spring-plate 156. It is preferred that spring-plate 156 is a square structure with about the same overall footprint as heat sink 112. Four cylindrical posts 158 are connected at the four corners of rectilinear heat sink 112 and disposed through cylindrical stiffening frame post holes 163, PLGA module carrier post holes 161, interposer frame post holes 160, PWB post holes 162, insulator post holes 165, stiffener plate post holes 164, and spring-plate post holes 166. Post mushroom heads 168 are formed at the ends of posts 158. The post mushroom heads 168 rest against spring-plate 156 and thereby prevent spring-plate 156 from moving downward.

Downward expansion or deflection forces from spring 154 are exerted directly upon spring-plate 156, which translates the forces through posts 158, heat sink 112, stiffener frame 103, PLGA module carrier 108, and interposer frame 102 (as well as the one or more interposers received therein) thereby forcing interposer frame 102 and the one or more interposers downward until interposer frame 102 and the one or more interposers come into contact with and exert force upon an upper surface of PWB 110. Preferably, a lower surface of heat sink 112 includes a standoff 115 that provides a suitable thermal interface material (TIM) thickness between the heat sink's lower surface and an upper surface of the one or more chips 114. That is, an interior portion of the heat sink's lower surface that overlies the one or more chips 114 is preferably stepped with respect to a peripheral portion of the heat sink's lower surface that overlies the stiffener frame 103.

Similarly, force from spring 154 is also exerted upwards by spring 154 and translated through stiffener plate 152 and insulator 116 into PWB 110, forcing PWB 110 upwards until PWB 110 comes into contact with and exerts force upon a lower surface of the interposer frame 102 (as well as upon a lower surface of each of the one or more interposers received therein). In this regard, the lower surface of the one or more interposers may include stops 350 (shown in FIG. 3, for example) upon which PWB 110 comes into contact. Accordingly, PWB 110 and the one or more interposers are forced toward each other with compressive forces upon the inverted hybrid LGA contacts 314 (shown in FIG. 3, for example) disposed therebetween to make mechanical/pressure contact with a set of corresponding interconnect pads 304 (shown in FIG. 3, for example) on PWB 110. Alternatively, or in addition, PWB 110 may include stops in the form of support projections extending from an upper surface thereof upon which the lower surface of the interposers come(s) into contact.

Spring-plate 156 also has a threaded screw 170 in the center of spring 154. When screw 170 is turned clockwise, its threads travel along corresponding thread grooves in a spring-plate screw hole 172 in spring-plate 156 and, accordingly, screw 170 moves upward toward and against stiffener plate 152. As screw 170 engages stiffener plate 152 and exerts force upward against it, corresponding relational force is exerted by the threads of screw 170 downward against the thread grooves in spring-plate 156. As illustrated above in the discussion of spring 154, the downward force exerted by screw 170 is translated by spring-plate 156, post mushroom heads 168, posts 158, heat sink 112, stiffener frame 103, PLGA module carrier 108, and interposer frame 102 (as well as the one or more interposers received therein), thereby forcing interposer frame 102 and the one or more interposers downward until interposer frame 102 and the one or more interposers (e.g., stops, if present) come into contact with and exert force upon an upper surface of PWB 110. Similarly, upward force from screw 170 is translated through stiffener plate 152 and insulator 116 into PWB 110, forcing PWB 110 upwards until PWB 110 comes into contact with and exerts force against the lower surface of interposer frame 102 and the one or more interposers (e.g., stops, if present). Accordingly, after screw 170 is rotated clockwise into contact with stiffener plate 152, additional clockwise rotation of screw 170 results in increasing compressive force exerted by PWB 110 and the one or more interposers upon the inverted hybrid LGA contacts 314 (shown in FIG. 3, for example) disposed therebetween to make mechanical/pressure contact with interconnect pads 304 (shown in FIG. 3, for example) on PWB 110.

FIG. 2 illustrates, in a bottom perspective view, the interposer frame 102 shown in FIG. 1. As shown in FIG. 2, in accordance with the preferred embodiments of the invention, the interposer frame 102 includes four apertures 202, 204, 206 and 208 arranged in quadrants, with each of the apertures 202, 204, 206 and 208 being configured to receive an LGA interposer 210 (only three of which are shown in FIG. 2). Each LGA interposer 210 has an array of spring-type inverted hybrid land grid array (LGA) contacts 314 (shown in FIG. 3, for example) captured in holes 212. One of the LGA interposers 210 has been removed in FIG. 2 to reveal an array of contact pads 220 on the module substrate 108 onto which are to be affixed inverted hybrid LGA contacts in accordance with the preferred embodiments of the present invention. The interposer frame 102 is constructed of non-conductive material, as is/are the LGA interposer(s). Typically, the interposer frame 102 is a molded insulator or thin polymer insulator, as is/are the LGA interposer(s).

Preferably, the stiffener frame 103 or "clam shell" is a molded insulator such as a molded polymer insulator. For example, the stiffener frame 103 may be a fiberglass reinforced epoxy resin.

Although not shown in FIG. 2, one or more "secondary component" contact regions (e.g., each with an array of contact pads analogous to the array of contact pads 220) may be provided on the lower surface of the PLGA module carrier 108 along with the array(s) of contact pads 220. Typically, secondary components mounted on the lower surface of the PLGA module carrier 108 have their electrical contacts pushed to these contact regions, which are typically strips or islands on the lower surface of the PLGA module carrier 108. Inverted hybrid LGA contacts may be affixed to the contact pads in these secondary component contact regions (in addition to being affixed to the contact pads 220) in accordance with the preferred embodiments of the present invention.

In general, there may be multiple types of contact regions (e.g., at least one array of contact pads 220, one or more secondary component contact regions, etc.) on the lower surface of the PLGA module carrier 108. These contact regions may be present in any number and arrangement.

Those skilled in the art will appreciate that the invention may be implemented with any number and arrangement of apertures. Moreover, one or more of the apertures 202, 204, 206 and 208 may be omitted in favor of a frame structure that has an integral, one-piece construction which incorporates one or more LGA interposers in a contiguous fashion. Hence, a frame structure in accordance with the preferred embodiments of the invention generally includes a land grid array insulator body having a frame portion and one or more interposer portions, wherein the frame portion and the one or more interposer portions may be constructed separately or together as one-piece. Handlability may be improved in accordance with the preferred embodiments of the present invention by providing handling positions on the one or more LGA interposers to minimize laminate damage to the PLGA module carrier.

In addition, the interposer frame 102 may include one or more apertures (not shown) to accommodate one or more secondary components mounted on the lower surface of the PLGA module carrier 108, as well as one or more apertures (not shown) each configured to receive an LGA interposer (analogous to the LGA interposer(s) 210) for each of the secondary component contact regions.

Typically, the apertures of a frame, such as interposer frame 102, serve to align the LGA interposers received therein so that contacts of the interposer properly register with contacts of the PWB at the LGA site and corresponding contacts of the electronics module. Accordingly, such a frame is often referred to as an "alignment frame". In accordance with the preferred embodiments of the present invention, the contacts of the interposer(s) are inverted hybrid LGA contacts captured in holes in the interposer(s) using conventional techniques. Essentially, these inverted hybrid LGA contacts are conventional "hybrid" LGA contacts that are turned "upside-down" with respect to their usual orientation. Preferably, the interposer frame serves to align the interposer(s) received therein so that the inverted hybrid LGA contacts properly register with the contact pads on the PLGA module carrier (i.e., contact pads for electrical connection to the primary component(s) as well as contact pads for electrical connection to the secondary component(s), if any), to which the inverted hybrid LGA contacts are then affixed simultaneously using surface-mount technology (SMT) in accordance with the preferred embodiments of the present invention. Similarly, the interposer frame also preferably serves to align the interposer(s) received therein so that the inverted hybrid LGA contacts properly register with contact pads on the PWB (i.e., contact pads for electrical connection to the primary component(s) as well as contact pads for electrical connection to the secondary component(s), if any), to which the inverted hybrid LGA contacts subsequently make mechanical/pressure contact in accordance with the preferred embodiments of the present invention.

Figure 3:
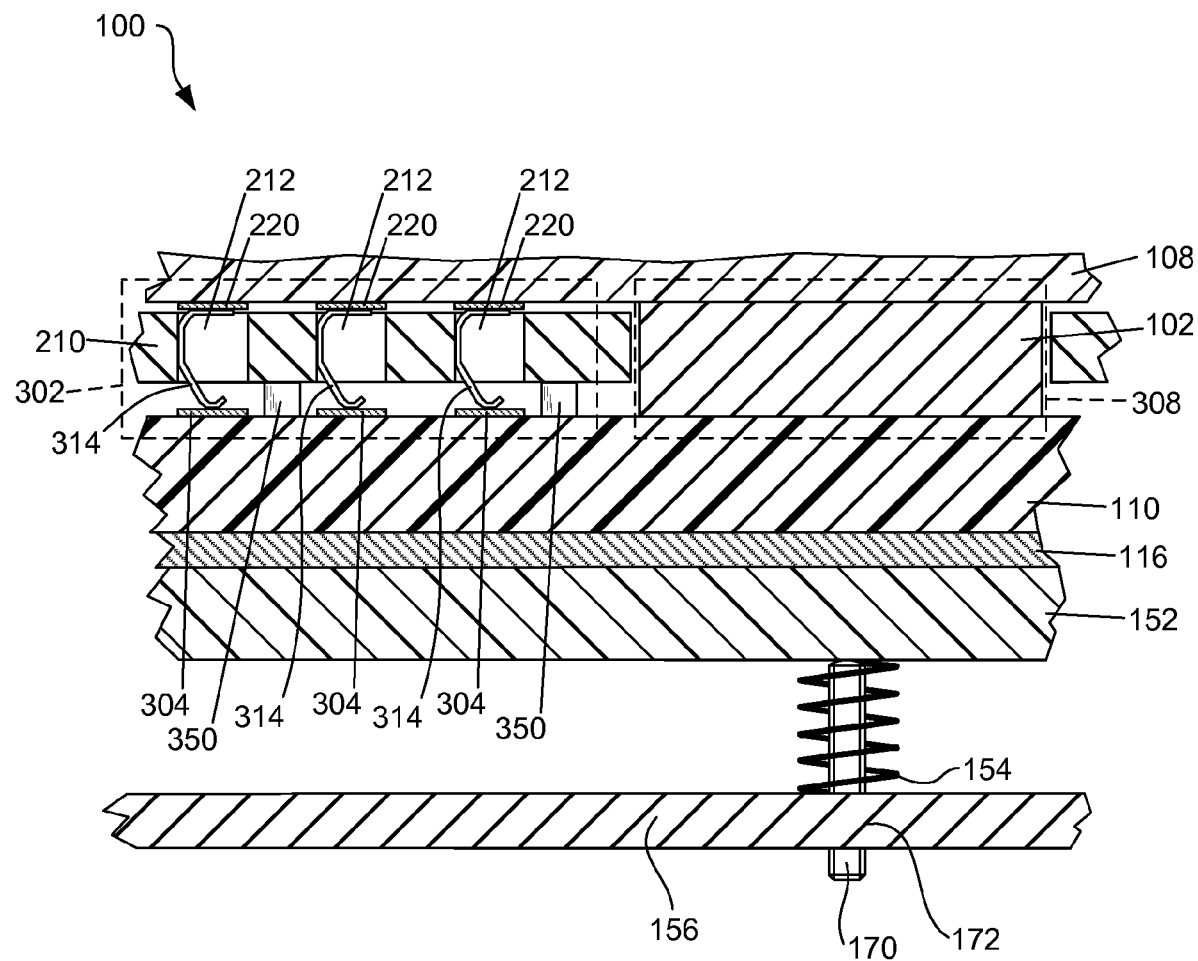
FIG. 3 is a partial, sectional view of the printed wiring board assembly (PWBA) of FIG. 1, taken along the section line indicated in FIG. 1.
Figure 4:
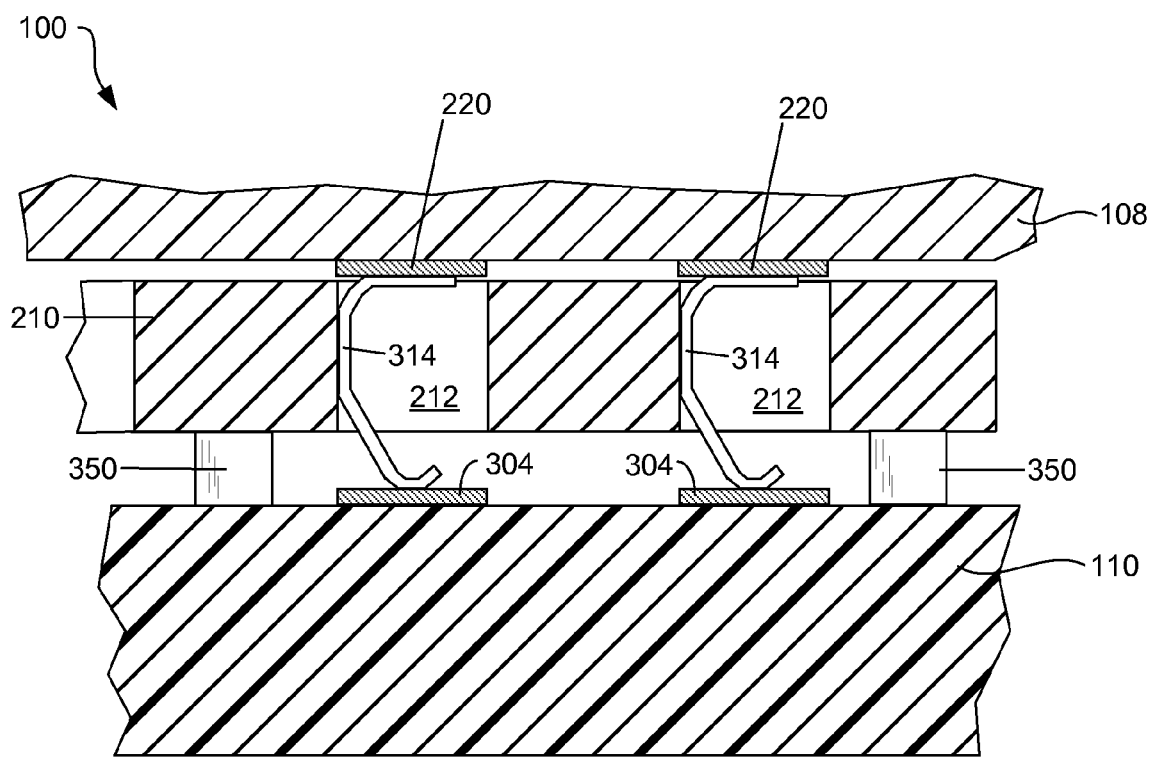
FIG. 4 is an enlarged partial, sectional view of the printed wiring board assembly (PWBA) of FIG. 3, in an area of a land grid array (LGA) interposer.
Figure 5:
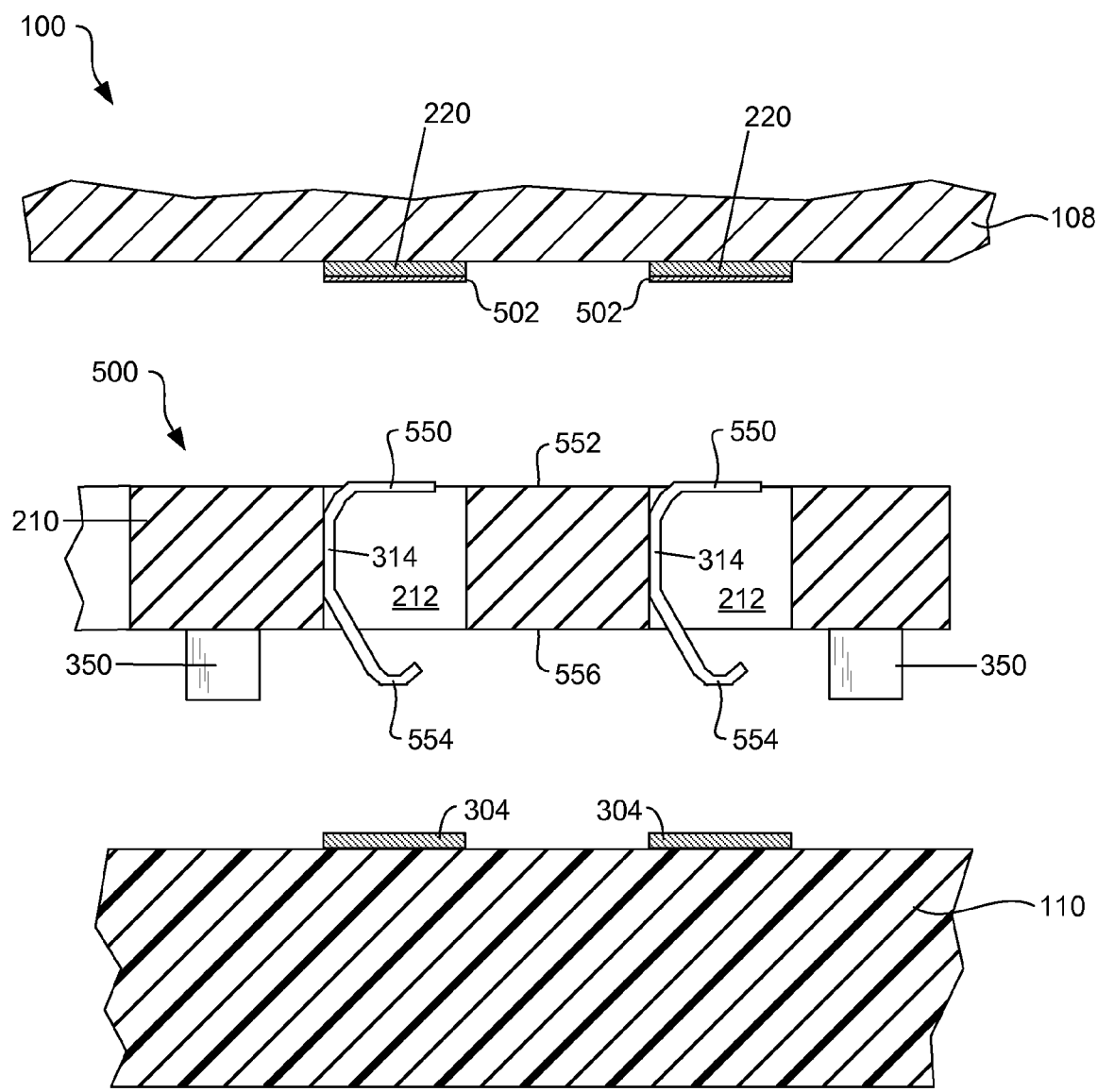
FIG. 5 is an unassembled version of the enlarged partial, sectional view of the printed wiring board assembly shown in FIG. 4.

Reference is now made to FIGS. 3-5. FIG. 3 illustrates, in a partial, sectional view, the printed wire board assembly 100 along the section line 3-3 of FIG. 1. More particularly, FIG. 3 shows a portion of a land grid array (LGA) site 302 comprising contact pads 220 of the PLGA module carrier 108 to which inverted hybrid land grid array (LGA) contacts are affixed and corresponding contact pads 304 of the PWB 110 to which the inverted hybrid LGA contacts 314 make mechanical/pressure contact in accordance with the preferred embodiments of the present invention, as well as an adjacent portion, outside the LGA site 302, of an interposer frame site 308. The contact pads 304 of the PWB 110 and the contact pads 220 of the PLGA module carrier 108 make electrical contact with each other at the LGA site 302 through spring-type inverted hybrid LGA contacts 314 captured in holes 212 of the LGA interposer 210 and affixed (e.g., using solder or electrically-conductive adhesive) to the contact pads 220 of the PLGA module carrier 108.

Typically, an LGA interposer, such as the LGA interposer 210, is a molded insulator or thin polymer insulator. In accordance with the preferred embodiments of the present invention a plurality of inverted hybrid LGA contacts, such as the spring-type inverted hybrid LGA contacts 314, are captured (e.g., press-fit) into holes drilled in the molded or thin polymer insulator. In general, these inverted hybrid LGA contacts may be of a press-fit design and/or friction fit design (e.g., waded wire buttons or molded metal filled elastomer contacts).

A plurality of stops 350 may be included between the LGA interposer 210 and the PWB 110. However, the stops 350 may be omitted. The stops 350, if present, preferably project from the LGA interposer 210. Alternatively, or in addition, at least some of the stops, if present, may project from the PWB 110.

The spring-type inverted hybrid LGA contacts 314 used in the LGA interposer 210 are conventional. Typically, these contacts are single layer contacts. However, at least some of the contacts 314 may have a plurality of layers, such as bimetallic contacts. Generally, single layer contacts use a monolithic alloy (e.g., beryllium-copper alloys, Cu—Ni—Si and similar Cu-based alloys) overplated with a noble metal (e.g., Au). On the other hand, multi-layer contacts generally consist of metallurgically bonded clad metal sheets; a clad metal inlay (e.g., Ag, Au, Pd or Pt; or alloys of Au, Pd and/or Pt with Ag, Ni or Cu) on a base metal carrier (e.g., stainless steel, highly alloyed Cu—Ni—Si, or other high strength formable alloy); or a highly conductive core (e.g., Ag, Au, Pd or Pt, or alloys of Au, Pd and Pt with Ag, Ni or Cu) clad to structural metal layers (e.g., stainless steel, beryllium-copper alloys, highly alloyed Cu—Ni—Si, or other high strength formable alloy). Multi-layered contacts may also be overplated with a noble metal (e.g., Au). Examples of tri-clad contacts include contacts of stainless steel/Ag/beryllium copper and contacts of stainless steel/Ag/stainless steel.

Referring temporarily to FIG. 5, in accordance with the preferred embodiments of the present invention, each of the spring-type inverted hybrid LGA contacts 314 extends in a substantially C-shape from a head portion 550 at or adjacent to an upper surface 552 of the LGA interposer 210 to a tail portion 554 at or adjacent to a lower surface 556 of the LGA interposer 210. The head portion 550 of each of the inverted hybrid LGA contacts 314 includes a substantially flat surface configured to be affixed (e.g., using a solder or an electrically-conductive adhesive) to one of the metal pads 220 on the PLGA module carrier 108. The tail portion 554 of each of the inverted hybrid LGA contacts 314 is configured to make mechanical/pressure contact with one of the metal pads 304 on the PWB 110.

Preferably, each of the spring-type inverted hybrid LGA contacts 314 is a monolithic alloy (e.g., a beryllium-copper alloy) spring having an electrolytic non-noble metal (e.g., Ni or a Ni-based alloy) underplating and an electrolytic noble metal (e.g., Au or a Au-based alloy) overplating. The electrolytic non-noble metal underplating is preferably 80-400 microinches thick to provide an enhanced diffusion barrier. The electrolytic noble metal overplating is preferably 30-60 microinches thick and incorporates one or more hardening agents to provide enhanced wear and corrosion resistance.

If the inverted hybrid LGA contacts 314 are to be soldered to the metal pads 220 on the PLGA module carrier 108 (e.g., the metal pads 220 on the PLGA module carrier 108 are stenciled with a solder paste, such as solder paste 502 shown in FIG. 5), preferably the head portion 550 of each of the inverted hybrid LGA contacts 314 and the metal pads 220 on the PLGA module carrier 108 is a highly conductive metal (e.g., Cu or a Cu-based alloy) that readily accepts a solder joint. In this regard, although each of the inverted hybrid LGA contacts 314 preferably is overplated with an electrolytic noble metal (e.g., Au or Au-based alloy), such an electrolytic noble metal overplating, if present, must be relatively thin (e.g., gold flash) at the head portion 550 of each of the inverted hybrid LGA contacts 314 so as not to introduce soldering issues when the inverted hybrid LGA contacts 314 are soldered to the metal pads 220.

The metal pads 220 are provided on the PLGA module carrier 108 using conventional techniques. Preferably, each of the metal pads 220 is a highly conductive metal (e.g., Cu or a Cu-based alloy) that readily accepts a solder joint. Although not necessary, the metal pad 220 may be overplated with a noble metal (e.g., Au). However, if the inverted hybrid LGA contacts 314 are to be soldered to the metal pads 220 on the PLGA module carrier 108, such a noble metal overplating, if present, must be relatively thin (e.g., gold flash) so as not to introduce soldering issues.

The spring-type inverted hybrid LGA contacts 314 shown in FIGS. 3-5 are exemplary. Those skilled in the art will appreciate that the invention may be implemented with inverted hybrid LGA contacts having a different configuration than that shown in FIG. 3. For example, the tail portion of each of the inverted hybrid LGA contacts may be configured to make mechanical/pressure contact with a pin contact on the PWB (rather than a pad contact). Moreover, those skilled in the art will appreciate that the invention may be implemented with other types of contacts, including resilient wire bundle contacts, molded metal filled elastomer contacts, press-fit pin contacts, and the like.

FIG. 4 illustrates, in an enlarged partial, sectional view, the printed wiring board assembly 100 in an area of one of the LGA interposers 210. FIG. 5 is an unassembled version of FIG. 4. That is, FIG. 5 illustrates, in an enlarged partial, sectional view, the printed wiring board assembly 100 in an area of one of the LGA interposers 210 in an unassembled state. FIGS. 3-5 illustrate an embodiment where the inverted hybrid LGA contacts 314 captured in the LGA interposer(s) 210 are soldered to the metal pads 220 on the PLGA module carrier 108. In the embodiment illustrated in FIGS. 3-5, surfaces of the LGA interposer(s) 210 and the PLGA module carrier 108 are not directly affixed to each other.

In another embodiment illustrated in FIGS. 8-9, discussed below, the inverted hybrid LGA contacts 314 captured in the LGA interposer(s) 210 are adhered to the metal pads 220 on the PLGA module carrier 108 using a electrically-conductive adhesive. In the embodiment illustrated in FIGS. 8-9, surfaces of the LGA interposer(s) 210 and the PLGA module carrier 108 are directly adhered to each other. In yet another embodiment illustrated in FIGS. 10-11, discussed below, the inverted hybrid LGA contacts 314 captured in the LGA interposer(s) 210 are soldered to the metal pads 220 on the PLGA module carrier 108 and, in addition, surfaces of the LGA interposer(s) 210 and the PLGA module carrier 108 are soldered together.

Returning now to the embodiment illustrated in FIGS. 3-5, each of the inverted hybrid LGA contacts 314 captured in the LGA interposer(s) 210 is soldered to one of the contact pad 220 of the PLGA module carrier 108 as best seen in FIG. 4. The solder layer is not shown in FIG. 4. As best seen in FIG. 5, each of the inverted hybrid LGA contacts 314 are first captured in the LGA interposer(s) 210 to form an inverted hybrid LGA interposer 500. Next, the inverted hybrid LGA contacts 314 captured in the inverted hybrid LGA interposer(s) 500 are affixed to the PLGA module carrier 108. This may be accomplished, as shown in FIG. 5, by stenciling the metal pads 220 on the PLGA module carrier 108 with a solder paste 502, then aligning the inverted hybrid LGA interposer(s) 500 with respect to the PLGA module carrier 108 so that each of the inverted hybrid LGA contacts 314 is positioned to abut against the solder paste 502 stenciled on the metal pads 220 on the PLGA module carrier, and subsequently reflowing the solder paste. Alternatively, rather than stenciling the solder paste 502 to the metal pads 220 on the PLGA module carrier 108, the solder paste 502 may be stenciled to the head portions 550 of the inverted hybrid LGA contacts 314 captured in the inverted hybrid LGA interposer(s) 500. In either case, all of the inverted hybrid LGA contacts 314 captured in the inverted LGA interposer(s) 500 are simultaneously soldered to their respective metal pads 220 on the PLGA module carrier 108.

Preferably, the metal pads 220 on the PLGA module carrier 108 are stenciled with the solder paste 502 using conventional stenciling techniques. For example, a conventional screen-printing technique may be utilized wherein a squeegee is used to force a solder paste through holes in a screen (e.g., stainless steel or polyester) and deposit the solder paste on the metal pads 220. The solder paste is a conventional mixture of solder particles and flux. As is well known, flux is a reducing agent that is utilized to improve the electrical connection by removing impurities, such as oxidized metals, from points of contact. The solder paste may be, for example, a mixture of lead (Pb)-containing solder particles (e.g., spheres of 60/40 Sn/Pb, 63/37 Sn/Pb, or other alloy of tin and lead) and/or lead (Pb)-free solder particles (e.g., spheres of SnAgCu) and flux (e.g., a rosin flux or a water-soluble flux).

One skilled in the art will appreciate that the choice of the solder utilized in the attachment of the inverted hybrid LGA contacts 314 to the organic package structure (e.g., the solder utilized in the solder paste 502 shown in FIG. 5, as well as the solder utilized in a fluxed solder preform 700 shown in FIG. 7 and in a solder paste 1102 shown in FIG. 11, each of which is further described below) may be at least partially influenced by the construction of the organic package structure and/or the assembly process flow. For example, the organic package structure may include at least one bare die or capped module 114 (shown in FIG. 1) that may (or may not) incorporate heat sensitive materials (e.g., thermal interface materials, lid glues/seal bands, support frame adds, etc.). Accordingly, it may be desirable to utilize low/lower melting point solder to accommodate such heat sensitive materials in the organic package structure and/or provide assembly process compatibility. For example, the use of Sn—Bi eutectic solder for inverted hybrid LGA contact attach, or other solder compositions with melting points/ranges below approximately 150 C, may offer additional assembly process flow flexibility when heat sensitive materials may be present in the organic package structure.

Figure 6:
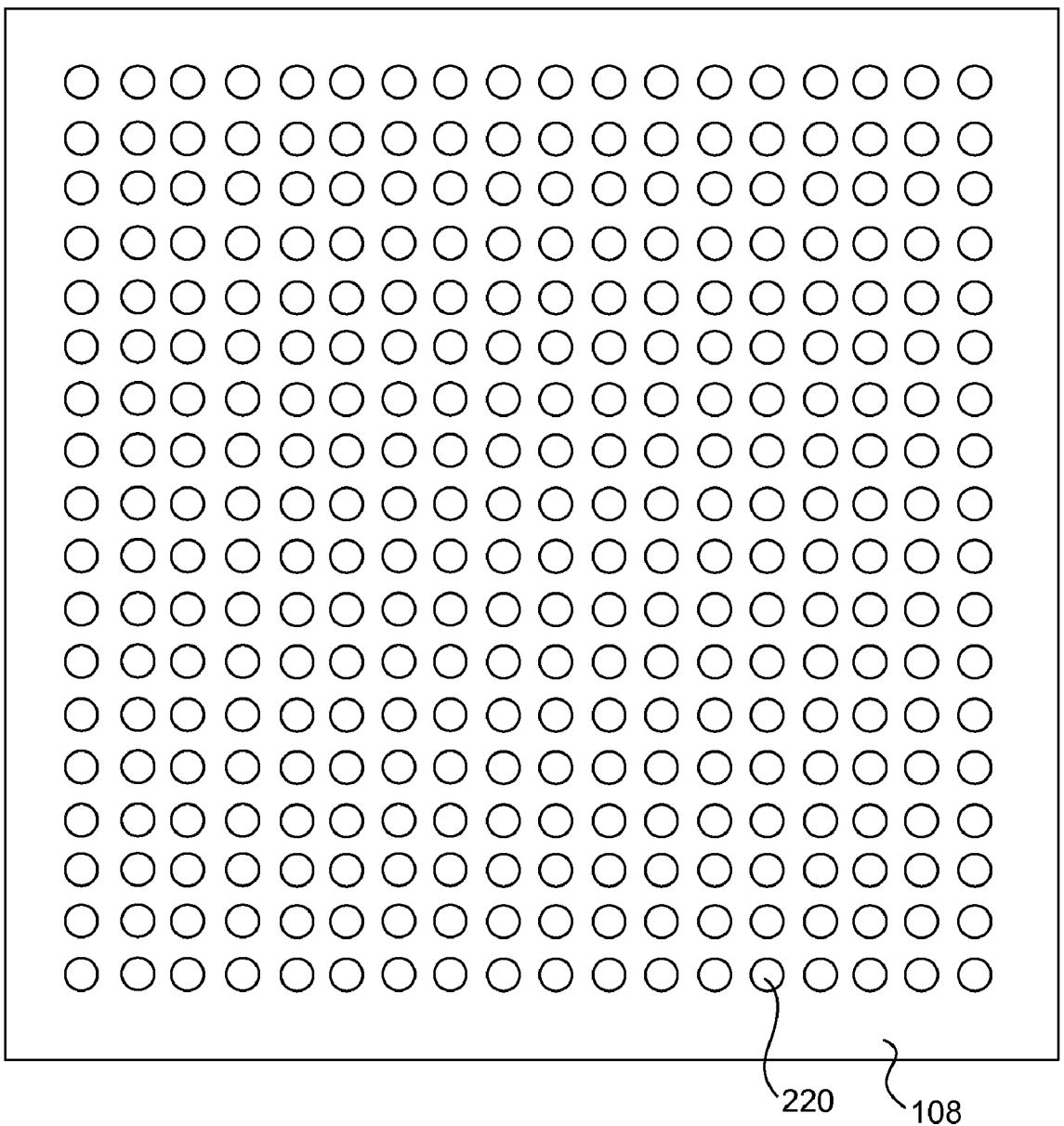
FIG. 6 is an enlarged bottom perspective view of the PLGA module carrier shown in FIG. 2 having metal pads onto which inverted hybrid land grid array (LGA) contacts are to be affixed in accordance with the preferred embodiments of the present invention.

FIG. 6 is an enlarged bottom perspective view of the PLGA module carrier 108 having metal pads 220 onto which the inverted hybrid LGA contacts 314 are to be affixed in accordance with the preferred embodiments of the present invention.

Referring temporarily back to FIGS. 4-5, in the embodiment just described the metal pads 220 on the PLGA module carrier 108 are stenciled with the solder paste 502. Alternatively, or in addition, solder paste may be applied to the head portion 550 of each of the inverted hybrid LGA contacts 314 captured in the LGA interposer(s) 210 using screen-printing techniques.

Figure 7:
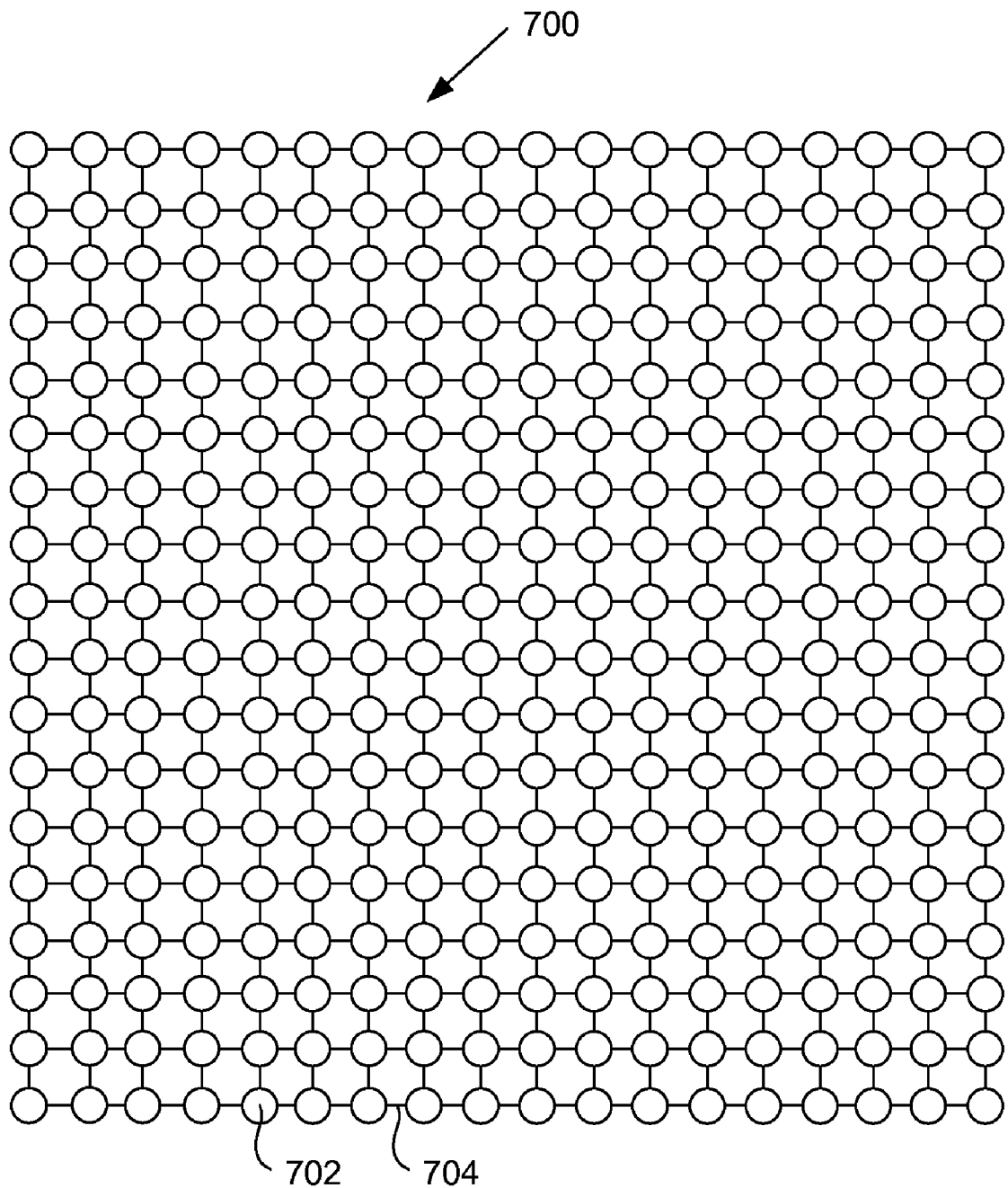
FIG. 7 is a top perspective view of a fluxed solder preform in accordance with the preferred embodiments of the present invention.

In an alternative to using screen-printing techniques to apply solder paste, solder may instead be applied to the metal pads on the PLGA module carrier and/or the head portion of each of the inverted hybrid LGA contacts captured in the inverted hybrid LGA interposer(s) through the utilization of a fluxed solder preform. FIG. 7 is a top perspective view of a fluxed solder preform 700 in accordance with the preferred embodiments of the present invention. The fluxed solder preform 700 includes an array of dots 702 connected by narrow strips 704. The array of dots 702 and the narrow strips 704 are configured so that the array of dots 704 will align with the metal pads on the PLGA module carrier and/or the head portions of the inverted hybrid LGA contacts captured in the LGA interposer(s). Preferably, the dots 702 and the narrow strips 704 are cut (e.g., stamped) from a sheet of solder paste, a sheet of solder that incorporates flux (e.g., a flux core), or a sheet of solder coated with flux. For example, the dots 702 and the narrow strips 704 may be stamped from a sheet of lead (Pb)-containing solder (e.g., 60/40 Sn/Pb, 63/37 Sn/Pb, or other alloy of tin and lead) and/or lead (Pb)-free solder (e.g., spheres of SnAgCu) having a flux core (e.g., a rosin flux or a water-soluble flux).

Preferably, the fluxed solder preform 700 is applied to the metal pads on the PLGA module carrier. Each inverted hybrid LGA interposer is then brought into alignment with the PLGA module carrier so that each of the inverted hybrid LGA contacts is positioned to abut against the fluxed solder preform 700 applied to the metal pads on the PLGA module carrier, and subsequently the fluxed solder preform 700 is reflowed. As the fluxed solder preform 700 reflows, surface tension draws the narrow strips 704 into the dots 702. Alternatively, rather than applying the fluxed solder preform 700 to the metal pads on the PLGA module carrier, the fluxed solder preform 700 may be applied to the head portions of the inverted hybrid LGA contacts captured in the inverted hybrid LGA interposer(s). In either case, all of the inverted hybrid LGA contacts 314 captured in the LGA interposer(s) 210 are simultaneously soldered to their respective metal pads 220 on the PLGA module carrier 108.

In another embodiment illustrated in FIGS. 8-9, discussed below, the inverted hybrid LGA contacts 314 captured in the LGA interposer(s) 210 are adhered to the metal pads 220 on the PLGA module carrier 108 using a electrically-conductive adhesive. In the embodiment illustrated in FIGS. 8-9, surfaces of the LGA interposer(s) 210 and the PLGA module carrier 108 are directly adhered to each other.

Figure 8:
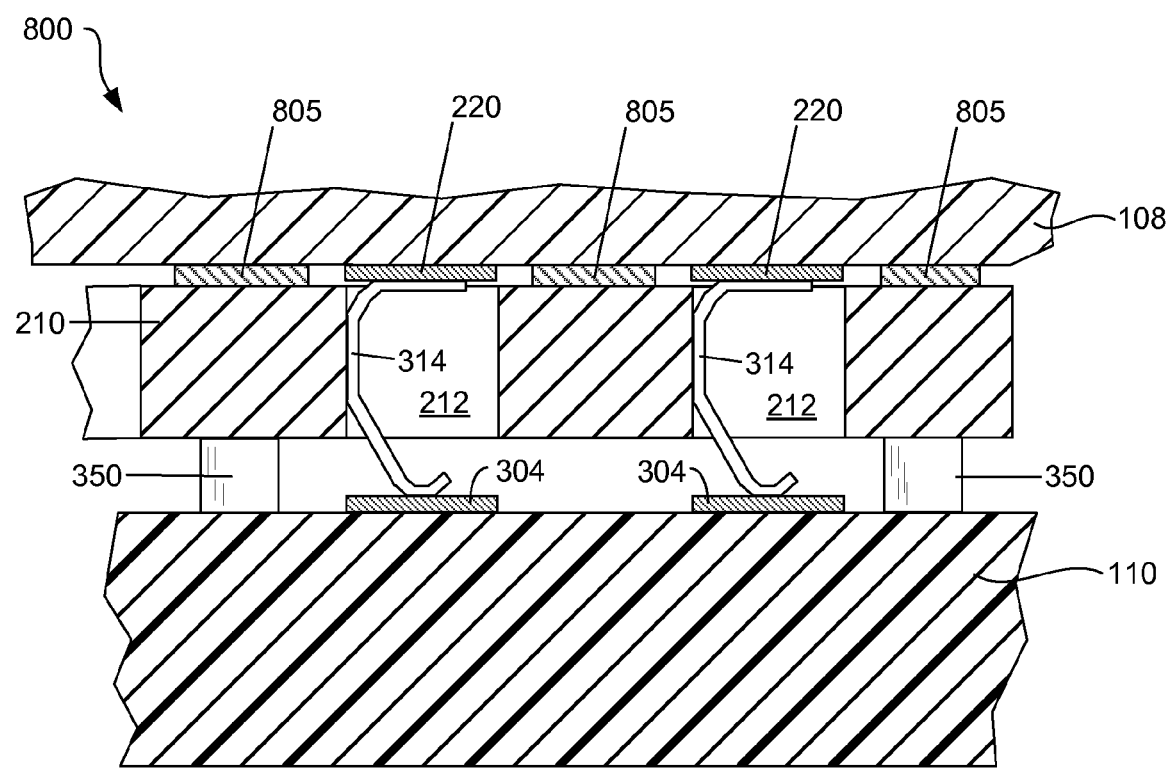
FIG. 8 is an enlarged partial, sectional view of a first modified-version of the printed wiring board assembly (PWBA) of FIG. 3, in an area of a land grid array (LGA) interposer.

FIG. 8 is an enlarged partial, sectional view of a printed wiring board assembly (PWBA) 800, in an area of a land grid array (LGA) interposer 210 in accordance with another embodiment of the present invention. The PWBA 800 illustrated in FIG. 8 is identical to the PWBA 100 illustrated in FIG. 3 except that an adhesive 805 is used to directly adhere surfaces of the LGA interposer(s) 210 and the plastic land grid array (PLGA) module carrier 108 to each other and an electrically-conductive adhesive (not shown in FIG. 8) is used to conductively adhere the inverted hybrid LGA contacts 314 captured in the LGA interposer(s) 210 to the metal pads 220 on the PLGA module carrier 108 in accordance with the preferred embodiments of the present invention.

Figure 9:
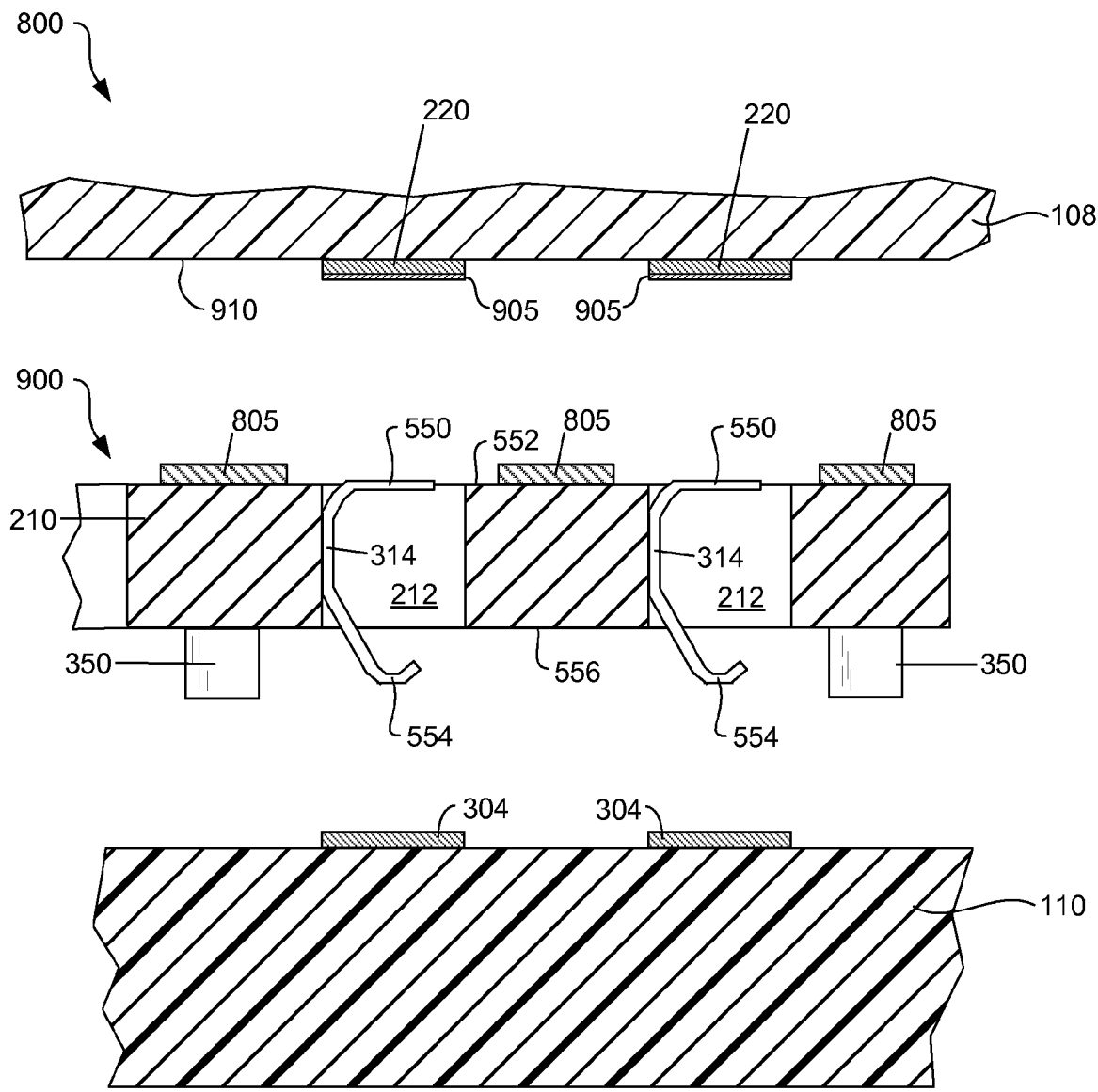
FIG. 9 is an unassembled version of the enlarged partial, sectional view of the first modified-version of the printed wiring board assembly shown in FIG. 8.

FIG. 9 is an unassembled version of the enlarged partial, sectional view of the PWBA 800 shown in FIG. 8. As best seen in FIG. 9, each of the inverted hybrid LGA contacts 314 are first captured in the LGA interposer(s) 210 to form an inverted hybrid LGA interposer 900. Next, an upper surface 552 of each of the inverted hybrid LGA interposer(s) 900 is coated with adhesive 805, preferably a conventional non-electrically-conductive adhesive, and the metal pads 220 of the PLGA module carrier 108 are coated with a conventional electrically-conductive adhesive 905 (electrically-conductive adhesives typically containing a noble or semi-noble metal) in accordance with the preferred embodiments of the present invention. This may be accomplished, for example, by stenciling the adhesive 805 onto the upper surface 552 of each of the inverted hybrid LGA interposer(s) 900, and stenciling the electrically-conductive adhesive 905 onto the metal pads 220 of the PLGA module carrier 108. The inverted hybrid LGA interposer(s) 900 is/are then aligned with respect to the PLGA module carrier 108 so that each of the inverted hybrid LGA contacts 314 is positioned to abut against the electrically-conductive adhesive 905 stenciled on the metal pads 220 on the PLGA module carrier 108. Once these components are aligned, the adhesive 805 and the electrically-conductive adhesive 905 are cured. Hence, all of the inverted hybrid LGA contacts 314 captured in the inverted hybrid LGA interposer(s) 900 are simultaneously adhered to their respective metal pads 220 on the PLGA module carrier 108, while at the same time directly adhering surfaces of the inverted hybrid LGA interposer(s) 900 and the PLGA module carrier 108 to each other.

Preferably, the metal pads 220 of the PLGA module carrier 108 and the upper surface 552 of each of the inverted hybrid LGA interposer(s) 900 are respectively stenciled with the electrically-conductive adhesive 905 and the adhesive 805 using conventional stenciling techniques. For example, a conventional screen-printing technique may be utilized wherein a squeegee is used to force an electrically-conductive adhesive through holes in a screen (e.g., stainless steel or polyester) and deposit the electrically-conductive adhesive on the metal pads 220, and another squeegee is used to force an electrically-nonconductive adhesive through holes in another screen (e.g., stainless steel or polyester) and deposit the electrically-nonconductive adhesive on the upper surface 552 of each of the inverted hybrid LGA interposer(s) 900.

Alternatively, or in addition, the head portion 550 of the inverted hybrid LGA contacts 314 may be coated with a conventional electrically-conductive adhesive (e.g., corresponding to the electrically-conductive adhesive 905) and/or a lower surface 910 of the PLGA module carrier 108 may be coated with a conventional adhesive (e.g., corresponding to the adhesive 805). For example, it may be desirable to apply the respective adhesives onto components of the same sub-assembly unit, e.g., a conventional electrically-conductive adhesive (e.g., corresponding to the electrically-conductive adhesive 905) may be stenciled on the head portion 550 of the inverted hybrid LGA contacts 314 and the adhesive 805 may be stenciled on the upper surface 552 of each of the inverted hybrid LGA interposer(s) 900, or the electrically-conductive adhesive 905 may be stenciled on the metal pads 220 of the PLGA module carrier 108 and a conventional adhesive (e.g., corresponding to the adhesive 805) may be stenciled on the lower surface 910 of the PLGA module carrier 108. Alternatively, the non-conductive adhesive may be a preform sheet that is die cut around the metal pads, which receive the electrically-conductive adhesive. This allows the electrically-conductive adhesive to be screen printed onto the metal pads, and then the non-conductive adhesive preform sheet to be placed around the electrically-conductive adhesive that is already screen-printed onto the metal pads. It may also be desirable to use a single adhesive, preferably a conventional electrically-conductive adhesive, in lieu of both the adhesive 805 and the electrically-conductive adhesive 905.

In yet another embodiment illustrated in FIGS. 10-11, discussed below, the inverted hybrid LGA contacts 314 captured in the LGA interposer(s) 210 are soldered to the metal pads 220 on the PLGA module carrier 108 and, in addition, surfaces of the LGA interposer(s) 210 and the PLGA module carrier 108 are soldered together.

Figure 10:
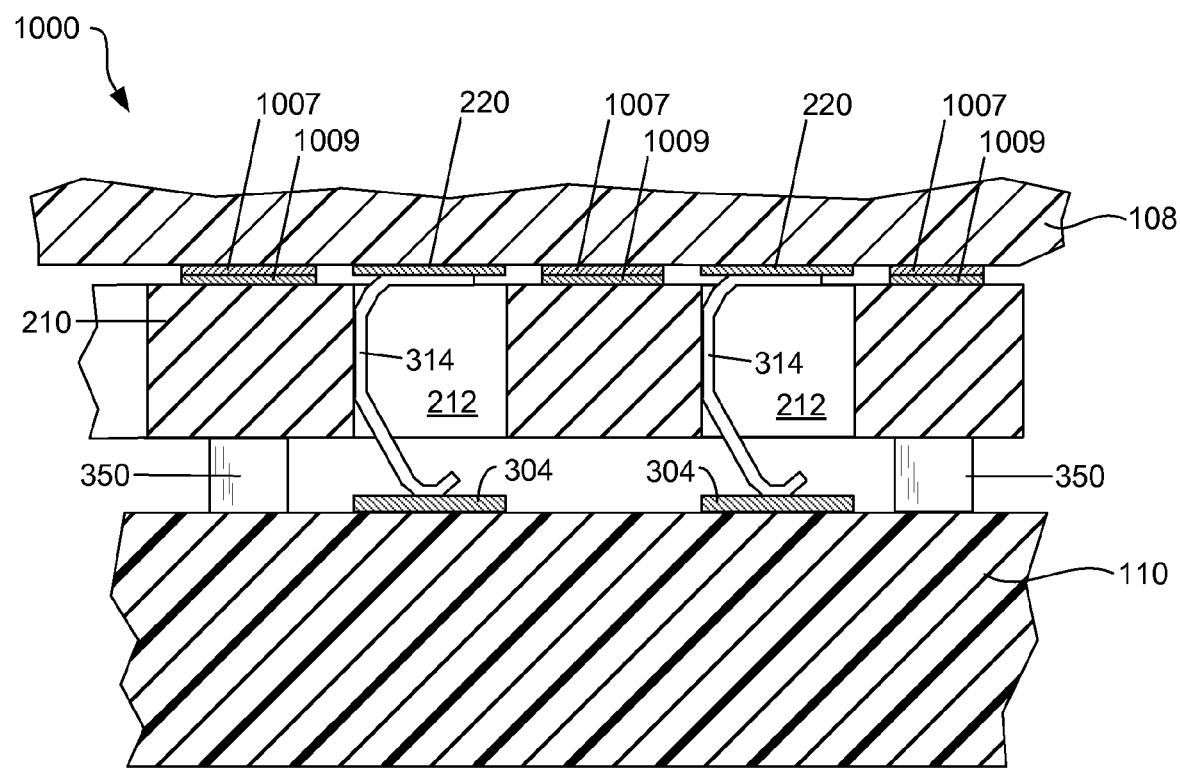
FIG. 10 is an enlarged partial, sectional view of a second modified-version of the printed wiring board assembly (PWBA) of FIG. 3, in an area of a land grid array (LGA) interposer.

FIG. 10 is an enlarged partial, sectional view of a printed wiring board assembly (PWBA) 1000, in an area of a land grid array (LGA) interposer 210 in accordance with yet another embodiment of the present invention. The PWBA 1000 illustrated in FIG. 10 is identical to the PWBA 100 illustrated in FIG. 3, except that the LGA interposer(s) 210 is/are affixed to the plastic land grid array (PLGA) module carrier 108 using metal support pads 1007 and 1009 that are soldered together in accordance with the preferred embodiments of the present invention.

The metal support pads 1007 are provided on the PLGA module carrier 108 using conventional techniques. Likewise, the metal support pads 1009 are provided on the LGA interposer(s) 210 using conventional techniques. Preferably, each of the metal support pads 1007 and 1009 is a metal that readily accepts a solder joint such as copper or a copper-based alloy.

Figure 11:
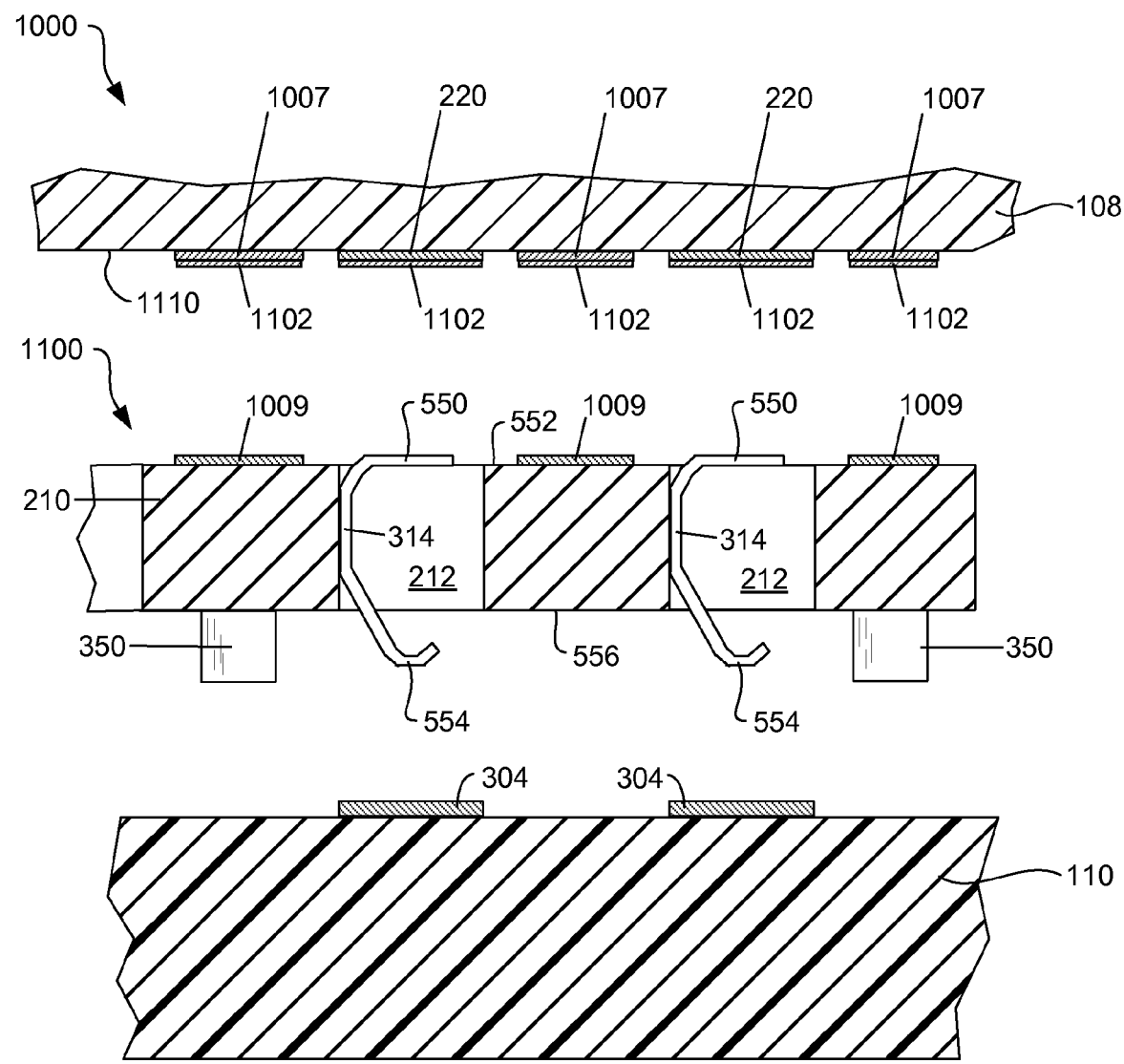
FIG. 11 is an unassembled version of the enlarged partial, sectional view of the second modified-version of the printed wiring board assembly shown in FIG. 10.

FIG. 11 is an unassembled version of the enlarged partial, sectional view of the PWBA 1000 shown in FIG. 10. As best seen in FIG. 11, each of the inverted hybrid LGA contacts 314 are first captured in the LGA interposer(s) 210 to form an inverted hybrid LGA interposer 1100. Next, the metal pads 220 and the metal support pads 1007 on the PLGA module carrier 108 are coated with a solder paste 1102 in accordance with the preferred embodiments of the present invention. This may be accomplished, for example, by stenciling the solder paste 1102 onto the metal pads 220 and the metal support pads 1007 of the PLGA module carrier 108. The inverted hybrid LGA interposer(s) 1100 is/are then aligned with respect to the PLGA module carrier 108 so that each of the metal support pads 1009 on the inverted hybrid LGA interposer(s) 1100 is positioned to abut against the solder paste 1102 stenciled on the metal support pads 1007 on the PLGA module carrier 108 and so that each of the inverted hybrid LGA contacts 314 is positioned to abut against the solder paste 1102 stenciled on the metal pads 220 on the PLGA module carrier. Once these components are aligned, the solder paste 1102 is reflowed. Hence, all of the inverted hybrid LGA contacts 314 captured in the inverted hybrid LGA interposer(s) 1100 are simultaneously soldered to their respective metal pads 220 on the PLGA module carrier 108, while at the same time soldering the surfaces of the inverted hybrid LGA interposer(s) 1100 and the PLGA module carrier 108 to each other (i.e., through metal support pads 1007 and 1009).

Preferably, the metal pads 220 and the metal support pads 1007 on the PLGA module carrier 108 are stenciled with the solder paste 1102 using conventional stenciling techniques. For example, a conventional screen-printing technique may be utilized wherein a squeegee is used to force a solder paste through holes in a screen (e.g., stainless steel or polyester) and deposit the solder paste on the metal pads 220 and the support metal pads 1007. The solder paste is a conventional mixture of solder particles and flux.

Alternatively, rather than stenciling the solder paste 1102 to the metal pads 220 and the metal support pads 1007 on the PLGA module carrier 108, the solder paste 1102 may be stenciled to the head portions 550 of the inverted hybrid LGA contacts 314 captured in the inverted hybrid LGA interposer(s) 1100 and the metal support pads 1009 on the inverted hybrid LGA interposer(s) 1100. The metal support pads 1009 on the inverted hybrid LGA interposer(s) 1100 and/or the head portions 550 of the inverted hybrid LGA contacts 314 could be solder plated as well.

In an alternative to using screen-printing techniques to apply solder paste, solder may instead be applied to the metal pads 220 and the metal support pads 1007 on the PLGA module carrier 108 and/or the head portion 550 of each of the inverted hybrid LGA contacts 314 captured in the inverted hybrid LGA interposer(s) 1100 and the metal support pads 1009 on the inverted hybrid LGA interposer(s) 1100 through the utilization of a fluxed solder preform (e.g., analogous to the fluxed solder preform 700 discussed above with reference to FIG. 7).

Figure 12:
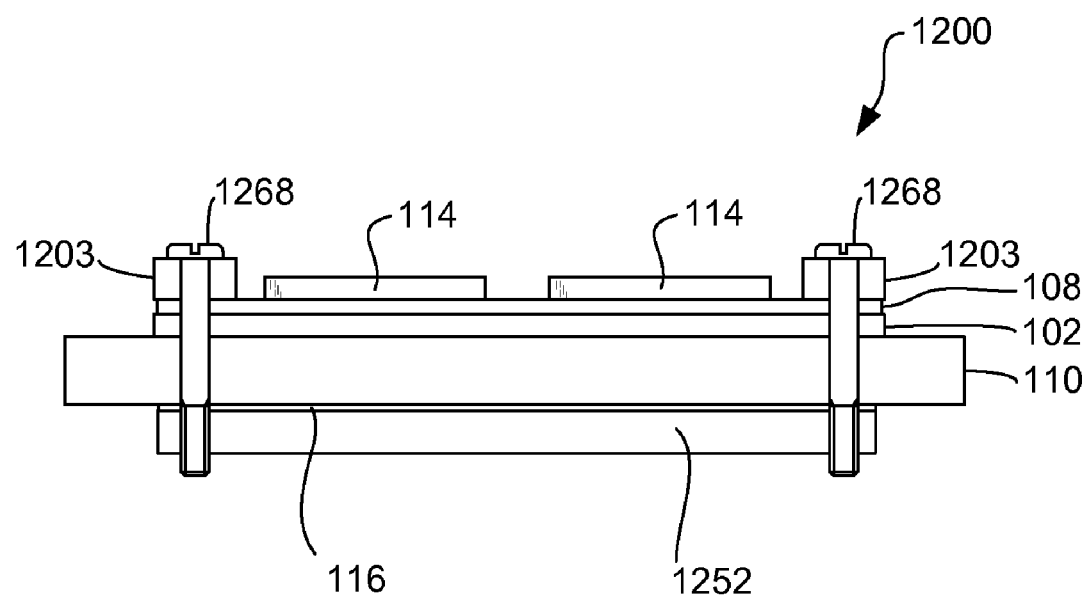
FIG. 12 is a side perspective view of a printed wiring board assembly (PWBA) having a printed wiring board (PWB) and a plastic land grid array (PLGA) module carrier that incorporates inverted hybrid land grid array (LGA) contacts in accordance with another embodiment of the present invention. The PWBA shown in FIG. 12 does not utilize a heat sink (unlike the PWBA shown in FIG. 1).

FIG. 12 is a side perspective view of a printed wiring board assembly (PWBA) 1200 having a printed wiring board (PWB) 110 and a plastic land grid array (PLGA) module carrier 108 that incorporates inverted hybrid land grid array (LGA) contacts (e.g., corresponding to the inverted hybrid LGA contacts 314 shown in FIG. 3) in accordance with the preferred embodiments of the present invention. The PWBA 1200 shown in FIG. 12 does not utilize a heat sink (unlike the PWBA 100 shown in FIG. 1). Hence, the PWBA 1200 may be used, for example, in an application where the one or more chips 114 are low power components requiring no additional thermal solution.

In the embodiment shown in FIG. 12, a stiffener frame 1203 lies above and enhances support for the PLGA module carrier 108, while an interposer frame 102 (as well one or more LGA interposer(s) received therein) lies below and supports the PLGA module carrier 108. The embodiment shown in FIG. 12 utilizes a threaded-fastener type clamping mechanism. Four threaded-fasteners 1268 (i.e., flat-headed screws) pass through holes in the stiffener frame 1203, the PLGA module carrier 108, the interposer frame 102, the PWB 110, the insulator 116, and a stiffener plate 1252. Each of the threaded-fasteners 1268 includes a head portion that is engaged against the top surface of the stiffener frame 1203 and a threaded portion that is threaded into a threaded hole in the stiffener plate 1252. The stiffener frame 1203 shown in FIG. 12 is identical to the stiffener frame 103 shown in FIG. 1. Similarly, the stiffener plate 1252 shown in FIG. 12 is identical to the stiffener plate 152 shown in FIG. 1 except that the stiffener plate 1252 contains four threaded holes into which are threaded the threaded-fasteners 1268.

The threaded-fastener type clamping mechanism shown in FIG. 12 is exemplary. One skilled in the art will appreciate that any of the many types and configurations of clamping mechanisms (e.g., pin staking, snap locks, adhesive, etc.) known in the art may be used in lieu of the threaded-fastener type clamping mechanism shown in FIG. 12.

Figure 13:
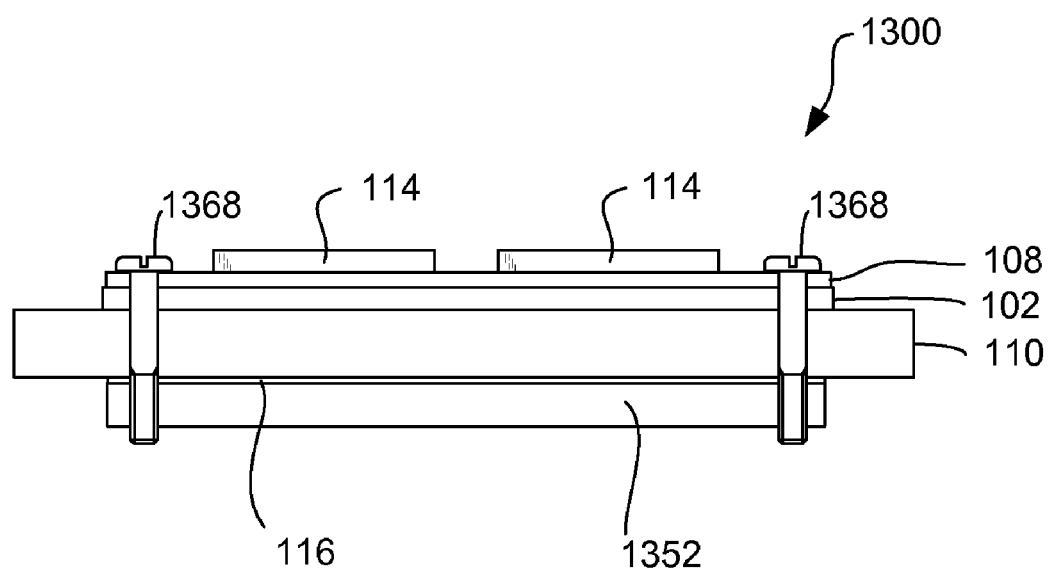
FIG. 13 is a side perspective view of a printed wiring board assembly (PWBA) having a printed wiring board (PWB) and a plastic land grid array (PLGA) module carrier that incorporates inverted hybrid land grid array (LGA) contacts in accordance with yet another embodiment of the present invention. The PWBA shown in FIG. 13 does not utilize a heat sink (unlike the PWBA shown in FIG. 1) and does not utilize a stiffener frame above the PLGA module carrier (unlike the PWBAs shown in FIGS. 1 and 12).

FIG. 13 is a side perspective view of a printed wiring board assembly (PWBA) 1300 having a printed wiring board (PWB) 110 and a plastic land grid array (PLGA) module carrier 108 that incorporates inverted hybrid land grid array (LGA) contacts (e.g., corresponding to the inverted hybrid LGA contacts 314 shown in FIG. 3) in accordance with the preferred embodiments of the present invention. The PWBA 1300 shown in FIG. 13 does not utilize a heat sink (unlike the PWBA 100 shown in FIG. 1) and does not utilize a stiffener frame above the PLGA module carrier (unlike the PWBA 100 shown in FIG. 1 and the PWBA 1200 shown in FIG. 12). Hence, the PWBA 1300 may be used, for example, in applications involving relatively small modules and/or relatively lower contact normal force and where the one or more chips 114 are low power components requiring no additional thermal solution.

In the embodiment shown in FIG. 13, an interposer frame 102 (as well one or more LGA interposer(s) received therein) lies below and supports the PLGA module carrier 108. The embodiment shown in FIG. 13 utilizes a threaded-fastener type clamping mechanism. Four threaded-fasteners 1368 (i.e., flat-headed screws) pass through holes in the PLGA module carrier 108, the interposer frame 102, the PWB 110, the insulator 116, and a stiffener plate 1352. Each of the threaded-fasteners 1368 includes a head portion that is engaged against the top surface of the PLGA module carrier 108 and a threaded portion that is threaded into a threaded hole in the stiffener plate 1352. The stiffener plate 1352 shown in FIG. 13 is identical to the stiffener plate 152 shown in FIG. 1 except that the stiffener plate 1352 contains four threaded holes into which are threaded the threaded-fasteners 1368.

The threaded-fastener type clamping mechanism shown in FIG. 13 is exemplary. One skilled in the art will appreciate that any of the many types and configurations of clamping mechanisms (e.g., pin staking, snap locks, adhesive, etc.) known in the art may be used in lieu of the threaded-fastener type clamping mechanism shown in FIG. 13.

In general, the preferred embodiments of the present invention facilitate improved reliability, handlability, integration of thermal solutions, and cost balance for pluggable packages with organic substrates or carriers when the module is to be a replaceable assembly. Reliability may be improved in accordance with the preferred embodiments of the present invention because, for example, planarity and support are maintained despite the application of significant actuation forces. Handlability may be improved in accordance with the preferred embodiments of the present invention by, for example, providing handling positions on the inverted hybrid LGA interposer(s) to minimize laminate damage to the PLGA module carrier. Integration of thermal solutions may be improved in accordance with the preferred embodiments of the present invention by, for example, providing direct load application to the PLGA module carrier and the chip thermal interface material (TIM)—an important factor in supporting bare die modules. Cost balance may be improved in accordance with the preferred embodiments of the present invention because, for example, Au plating of the PLGA module carrier is not required.

One skilled in the art will appreciate that many variations are possible within the scope of the present invention. For example, although the preferred embodiments of the present invention are described herein within the context of a PLGA module with an inverted hybrid LGA interposer that connects the PLGA module to a PWB, one skilled in the art will appreciate that a PLGA module with an inverted hybrid LGA interposer in accordance with the present invention may be utilized in connecting the PLGA module to any substrate, such as a ribbon substrate or another electronic module. Thus, while the present invention has been particularly shown and described with reference to the preferred embodiments thereof, it will be understood by those skilled in the art that these and other changes in form and detail may be made therein without departing from the spirit and scope of the present invention.

What is claimed is:

1. An apparatus, comprising:
    a plastic land grid array (PLGA) module carrier having a first surface with one or more chips mounted thereon and a second surface with a plurality of metal pads;
    a land grid array (LGA) interposer having a first surface and a second surface, wherein a plurality of holes pass through the LGA interposer from the first surface to the second surface;

a plurality of inverted hybrid LGA contacts each respectively captured in and extending at least partially through one of the holes of the LGA interposer, wherein each of the inverted hybrid LGA contacts is affixed to one of the metal pads on the PLGA module carrier and configured to make mechanical/pressure contact with a metal contact on a substrate to be placed adjacent to the second surface of the LGA interposer.

2. The apparatus as recited in claim 1, wherein each of the inverted hybrid LGA contacts is affixed to one of the metal pads on the PLGA module carrier using a solder or an electrically-conductive adhesive.

3. The apparatus as recited in claim 1, wherein the first surface of the LGA interposer is affixed to the second surface of the PLGA module carrier using a solder or an adhesive.

4. The apparatus as recited in claim 1, wherein each of the inverted hybrid LGA contacts extends in a substantially C-shape from a head portion thereof at or adjacent to the first surface of the LGA interposer to a tail portion thereof at or adjacent to the second surface of the LGA interposer, wherein the head portion includes a substantially flat surface affixed to one of the metal pads on the PLGA module carrier, and wherein the tail portion is configured to make mechanical/pressure contact with the metal contact on the substrate to be placed adjacent to the second surface of the LGA interposer.

5. The apparatus as recited in claim 1, further comprising:
a clamping mechanism applying a clamping force that urges the PLGA module carrier and a printed wiring board (PWB) placed adjacent to the second surface of the LGA interposer toward each other so that each of the inverted hybrid LGA contacts makes mechanical/pressure contact with a metal pad on the PWB.

6. The apparatus as recited in claim 1, further comprising:
a stiffener frame abutting a peripheral portion of the first surface of the PLGA module carrier;
a clamping mechanism applying through the stiffener frame a clamping force that urges the PLGA module carrier and a printed wiring board (PWB) placed adjacent to the second surface of the LGA interposer toward each other so that each of the inverted hybrid LGA contacts makes mechanical/pressure contact with a metal pad on the PWB.

7. The apparatus as recited in claim 1, further comprising:
a stiffener frame abutting a peripheral portion of the first surface of the PLGA module carrier;
a heat sink having a lower surface with a peripheral portion abutting the stiffener frame;
a clamping mechanism applying through the heat sink and the stiffener frame a clamping force that urges the PLGA module carrier and a printed wiring board (PWB) placed adjacent to the second surface of the LGA interposer toward each other so that each of the inverted hybrid LGA contacts makes mechanical/pressure contact with a metal pad on the PWB.

8. The apparatus as recited in claim 7, wherein the lower surface of the heat sink includes an interior portion that overlies the one or more chips mounted on the first surface of the PLGA module carrier and that is stepped with respect to the peripheral portion of the heat sink's lower surface so as to provide a thermal interface material (TIM) thickness between the interior portion of the heat sink's lower surface and an upper surface of each of the one or more chips mounted on the first surface of the PLGA module carrier.

9. A method comprising the steps of:
providing a plastic land grid array (PLGA) module carrier having a first surface with one or more chips and a second surface with a plurality of metal pads;
providing an inverted hybrid land grid array (LGA) interposer having a first surface and a second surface, wherein a plurality of holes pass through the inverted hybrid LGA interposer from the first surface to the second surface, wherein the inverted hybrid LGA interposer includes a plurality of inverted hybrid LGA contacts each captured in and extending at least partially through one of the holes of the inverted hybrid LGA interposer, and wherein each of the inverted hybrid LGA contacts is respectively configured for attachment to one of the metal pads on the PLGA module carrier and to make mechanical/pressure contact with a metal contact on a substrate to be placed adjacent to the second surface of the inverted hybrid LGA interposer;
positioning the PLGA module carrier adjacent to the first surface of the inverted hybrid LGA interposer;
affixing the plurality of inverted hybrid LGA contacts captured in the inverted hybrid LGA interposer to the plurality of metal pads on the PLGA module carrier so that each of the inverted hybrid LGA contacts is respectively attached to one of the plurality of metal pads.

10. The method as recited in claim 9, wherein the step of providing a PLGA module carrier includes the step of:
stenciling the metal pads on the PLGA module carrier with a solder paste.

11. The method as recited in claim 10, wherein the step of affixing the plurality of inverted hybrid LGA contacts captured in the inverted hybrid LGA interposer to the plurality of metal pads on the PLGA module carrier includes the steps of:
aligning the inverted hybrid LGA interposer with respect to the PLGA module carrier so that each of the inverted hybrid LGA contacts captured in the inverted hybrid LGA interposer is positioned to abut against the solder paste stenciled on the metal pads on the PLGA module carrier;
reflowing the solder paste after the aligning step is completed.

12. The method as recited in claim 9, wherein the step of providing a PLGA module carrier includes the step of:
applying a fluxed solder preform to the metal pads on the PLGA module carrier.

13. The method as recited in claim 12, wherein the step of affixing the plurality of inverted hybrid LGA contacts captured in the inverted hybrid LGA interposer to the plurality of metal pads on the PLGA module carrier includes the steps of:
aligning the inverted hybrid LGA interposer with respect to the PLGA module carrier so that each of the inverted hybrid LGA contacts captured in the LGA interposer is positioned to abut against the fluxed solder preform applied to the metal pads on the PLGA module carrier;
reflowing the fluxed solder preform after the aligning step is completed.

14. The method as recited in claim 9, wherein the step of providing a PLGA module carrier includes the step of:
applying an electrically-conductive adhesive to the metal pads on the PLGA module carrier.

15. The method as recited in claim 14, wherein the step of affixing the plurality of inverted hybrid LGA contacts captured in the inverted hybrid LGA interposer to the plurality of metal pads on the PLGA module carrier includes the steps of:
aligning the inverted hybrid LGA interposer with respect to the PLGA module carrier so that each of the inverted hybrid LGA contacts captured in the inverted hybrid LGA interposer is positioned to abut against the electrically-conductive adhesive applied to the metal pads on the PLGA module carrier;

curing the electrically-conductive adhesive after the aligning step is completed.

16. The method as recited in claim 9, further comprising the step of:
    affixing the first surface of the inverted hybrid LGA interposer to the second surface of the PLGA module carrier using a solder or an adhesive.

17. The method as recited in claim 9, wherein each of the inverted hybrid LGA contacts extends in a substantially C-shape from a head portion thereof at or adjacent to the first surface of the inverted hybrid LGA interposer to a tail portion thereof at or adjacent to the second surface of the inverted hybrid LGA interposer, wherein the head portion includes a substantially flat surface configured for attachment to one of the metal pads on the PLGA module carrier, and wherein the tail portion is configured to make mechanical/pressure contact with a metal contact on a substrate to be placed adjacent to the second surface of the inverted hybrid LGA interposer.

18. The method as recited in claim 9, wherein a stiffener frame abuts a peripheral portion of the first surface of the PLGA module carrier, the method further comprising the step of:
    applying through the stiffener frame a clamping force that urges the PLGA module carrier and a printed wiring board (PWB) placed adjacent to the second surface of the inverted hybrid LGA interposer toward each other so that each of the inverted hybrid LGA contacts makes mechanical/pressure contact with a metal pad on the PWB.

19. The method as recited in claim 9, wherein a stiffener frame abuts a peripheral portion of the first surface of the PLGA module carrier, and wherein a heat sink having a lower surface with a peripheral portion abuts the stiffener frame, the method further comprising the step of:
    applying through the heat sink and the stiffener frame a clamping force that urges the PLGA module carrier and a printed wiring board (PWB) placed adjacent to the second surface of the inverted hybrid LGA interposer toward each other so that each of the inverted hybrid LGA contacts makes mechanical/pressure contact with a metal pad on the PWB.

20. A method comprising the steps of:
    providing a plastic land grid array (PLGA) module carrier having a first surface with one or more chips and a second surface with a plurality of metal pads;
    providing a inverted hybrid land grid array (LGA) interposer having a first surface and a second surface, wherein a plurality of holes pass through the inverted hybrid LGA interposer from the first surface to the second surface, wherein the inverted hybrid LGA interposer includes a plurality of inverted hybrid LGA contacts each captured in and extending at least partially through one of the holes of the inverted hybrid LGA interposer, and wherein each of the inverted hybrid LGA contacts is respectively configured for attachment to one of the metal pads on the PLGA module carrier and to make mechanical/pressure contact with a metal contact on a substrate to be placed adjacent to the second surface of the LGA interposer;
    providing solder on the metal pads on the PLGA module carrier and/or on the inverted hybrid LGA contacts;
    aligning the inverted hybrid LGA interposer with respect to the PLGA module carrier so that each of the inverted hybrid LGA contacts captured in the inverted hybrid LGA interposer is respectively registered with one of the metal pads on the PLGA module carrier with the solder being sandwiched therebetween;
    reflowing the solder after the aligning step is completed so that each of the inverted hybrid LGA contacts is respectively attached to one of the plurality of metal pads.

* * * * *